US012684791B2

(12) United States Patent
Shimizu

(10) Patent No.: US 12,684,791 B2
(45) Date of Patent: Jul. 14, 2026

(54) SEMICONDUCTOR DEVICE MANUFACTURING METHOD

(71) Applicant: KABUSHIKI KAISHA TOSHIBA, Tokyo (JP)

(72) Inventor: Tatsuo Shimizu, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 523 days.

(21) Appl. No.: 18/462,876

(22) Filed: Sep. 7, 2023

(65) Prior Publication Data

US 2024/0313083 A1 Sep. 19, 2024

(30) Foreign Application Priority Data

Mar. 14, 2023 (JP) ................................. 2023-039307

(51) Int. Cl.
*H10D 62/832* (2025.01)
*H10D 12/01* (2025.01)
*H10D 30/66* (2025.01)
*H10P 30/22* (2026.01)

(52) U.S. Cl.
CPC ........... *H10D 12/031* (2025.01); *H10D 30/66* (2025.01); *H10D 62/8325* (2025.01); *H10P 30/22* (2026.01)

(58) Field of Classification Search
CPC ........... H10D 62/8325; H10D 64/0115; H10D 64/0123; H10D 64/01366; H10D 84/035;
(Continued)

(56) References Cited

U.S. PATENT DOCUMENTS 6,096,607 A 8/2000 Ueno
6,858,537 B2 * 2/2005 Brewer ................... C03C 19/00
257/E21.219
(Continued)

FOREIGN PATENT DOCUMENTS

JP H11-68097 A 3/1999
JP 2000-150875 A 5/2000
(Continued)

OTHER PUBLICATIONS

Heiji Watanabe et al., "Surface Cleaning and Etching of 4H-SiC(0001) Using High-Density Atmospheric Pressure Hydrogen Plasma," Journal of Nanoscience and Nanotechnology, vol. 11, No. 4, pp. 2802-2802 (2011).
(Continued)

*Primary Examiner* — Eric A. Ward
(74) *Attorney, Agent, or Firm* — Finnegan, Henderson, Farabow, Garrett & Dunner, LLP

(57) ABSTRACT

A semiconductor device manufacturing method of embodiments includes: performing first ion implantation for implanting aluminum into a silicon carbide layer with a first dose amount; performing first heat treatment at a temperature equal to or more than 1600° C.; performing first etching process for etching a surface of the silicon carbide layer in an atmosphere containing plasma generated from a gas containing halogen and oxygen; performing second etching process for etching the surface in an atmosphere containing hydrogen plasma or atomic hydrogen; forming a silicon oxide film on the surface; and forming a gate electrode on the silicon oxide film.

21 Claims, 37 Drawing Sheets

(58) Field of Classification Search
CPC ............. H10P 30/2042; H10P 14/3408; H10P 14/2904; H10P 14/3208
See application file for complete search history.

(56) References Cited

U.S. PATENT DOCUMENTS

| | | | | |
|---|---|---|---|---|
| 2012/0178259 | A1* | 7/2012 | Miyazaki | .............. H10P 70/20 257/E21.24 |
| 2013/0023113 | A1* | 1/2013 | Masuda | .............. H10D 30/668 257/E21.135 |
| 2016/0190234 | A1 | 6/2016 | Iijima et al. | |
| 2018/0005828 | A1 | 1/2018 | Fujii et al. | |
| 2019/0228971 | A1* | 7/2019 | Iguchi | .................. H10D 8/411 |
| 2021/0296128 | A1 | 9/2021 | Shimizu et al. | |
| 2022/0005925 | A1 | 1/2022 | Shimizu et al. | |
| 2023/0197790 | A1 | 6/2023 | Shimizu et al. | |

FOREIGN PATENT DOCUMENTS

| | | |
|---|---|---|
| JP | 2004-253576 A | 9/2004 |
| JP | 2016-15439 A | 1/2016 |
| JP | 2016-127073 A | 7/2016 |
| JP | 2020-31157 A | 2/2020 |
| JP | 2020-202393 A | 12/2020 |
| JP | 2021-153168 A | 9/2021 |
| JP | 2022-12282 A | 1/2022 |
| JP | 2023-90232 A | 6/2023 |
| WO | WO 2017/17858 A1 | 2/2017 |

OTHER PUBLICATIONS

Keita Tachiki, et al., "Formation of high-quality SiC(0001)/SiO$_2$ structures by excluding oxidation process with H$_2$ etching before SiO$_2$ deposition and high-temperature N$_2$ annealing," Applied Physics Express vol. 13, Art. 121002, 5 pages, DOI: 10.35848/1882-0786/abc6ed (2020).

Keita Tachiki, et al., "Mobility improvement of 4H-SiC (0001) MOSFETs by a three-step process of H$_2$ etching, SiO$_2$ deposition, and interface nitridation," Applied Physics Express vol. 14, Art. 031001, 6 pages, DOI: https://doi.org/10.35848/1882-0786/abdcd9 (2021).

* cited by examiner

FIG.3

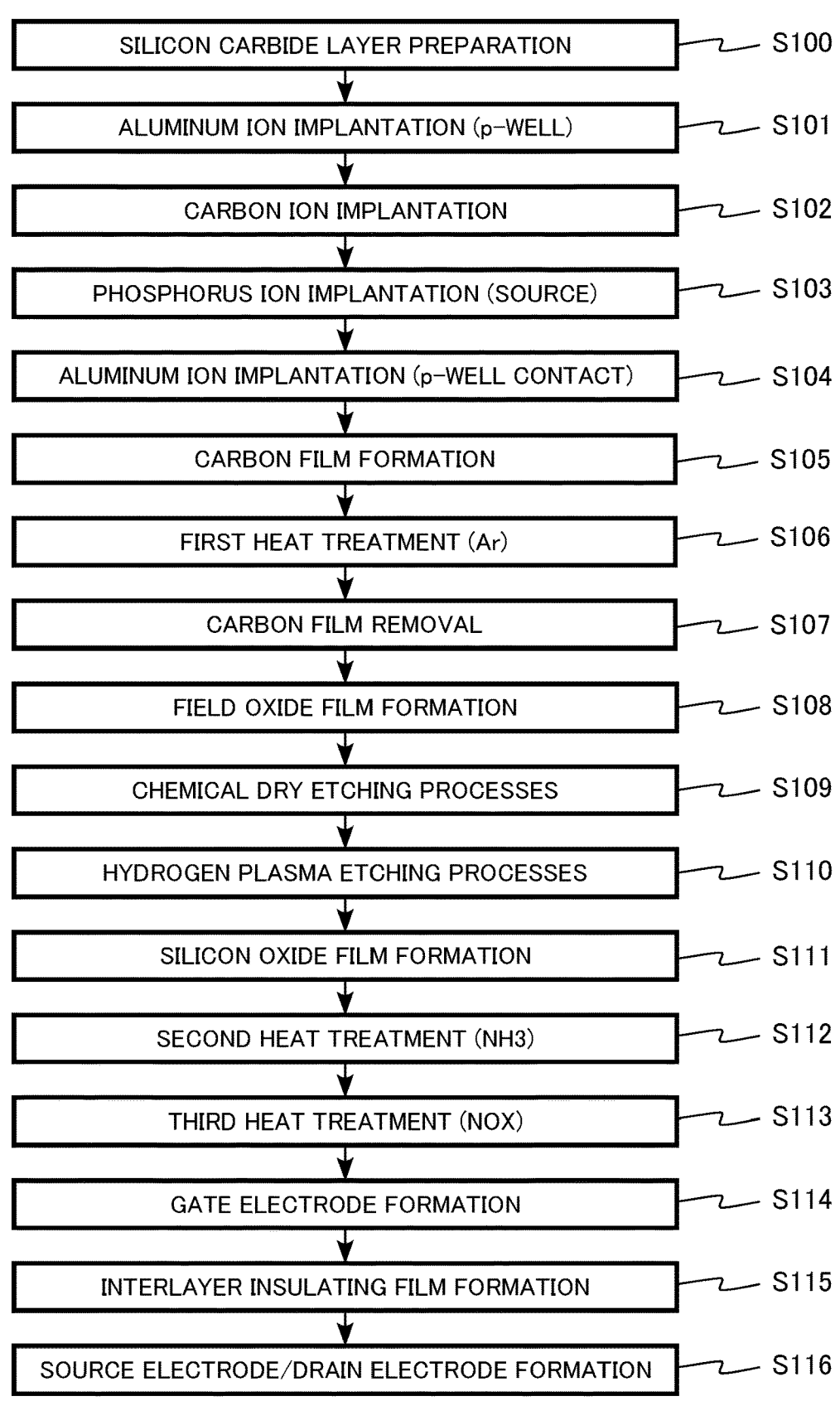

| | |
|---|---|
| SILICON CARBIDE LAYER PREPARATION | S100 |
| ALUMINUM ION IMPLANTATION (p-WELL) | S101 |
| CARBON ION IMPLANTATION | S102 |
| PHOSPHORUS ION IMPLANTATION (SOURCE) | S103 |
| ALUMINUM ION IMPLANTATION (p-WELL CONTACT) | S104 |
| CARBON FILM FORMATION | S105 |
| FIRST HEAT TREATMENT (Ar) | S106 |
| CARBON FILM REMOVAL | S107 |
| FIELD OXIDE FILM FORMATION | S108 |
| CHEMICAL DRY ETCHING PROCESSES | S109 |
| HYDROGEN PLASMA ETCHING PROCESSES | S110 |
| SILICON OXIDE FILM FORMATION | S111 |
| SECOND HEAT TREATMENT (NH3) | S112 |
| THIRD HEAT TREATMENT (NOX) | S113 |
| GATE ELECTRODE FORMATION | S114 |
| INTERLAYER INSULATING FILM FORMATION | S115 |
| SOURCE ELECTRODE/DRAIN ELECTRODE FORMATION | S116 |

FIG.20

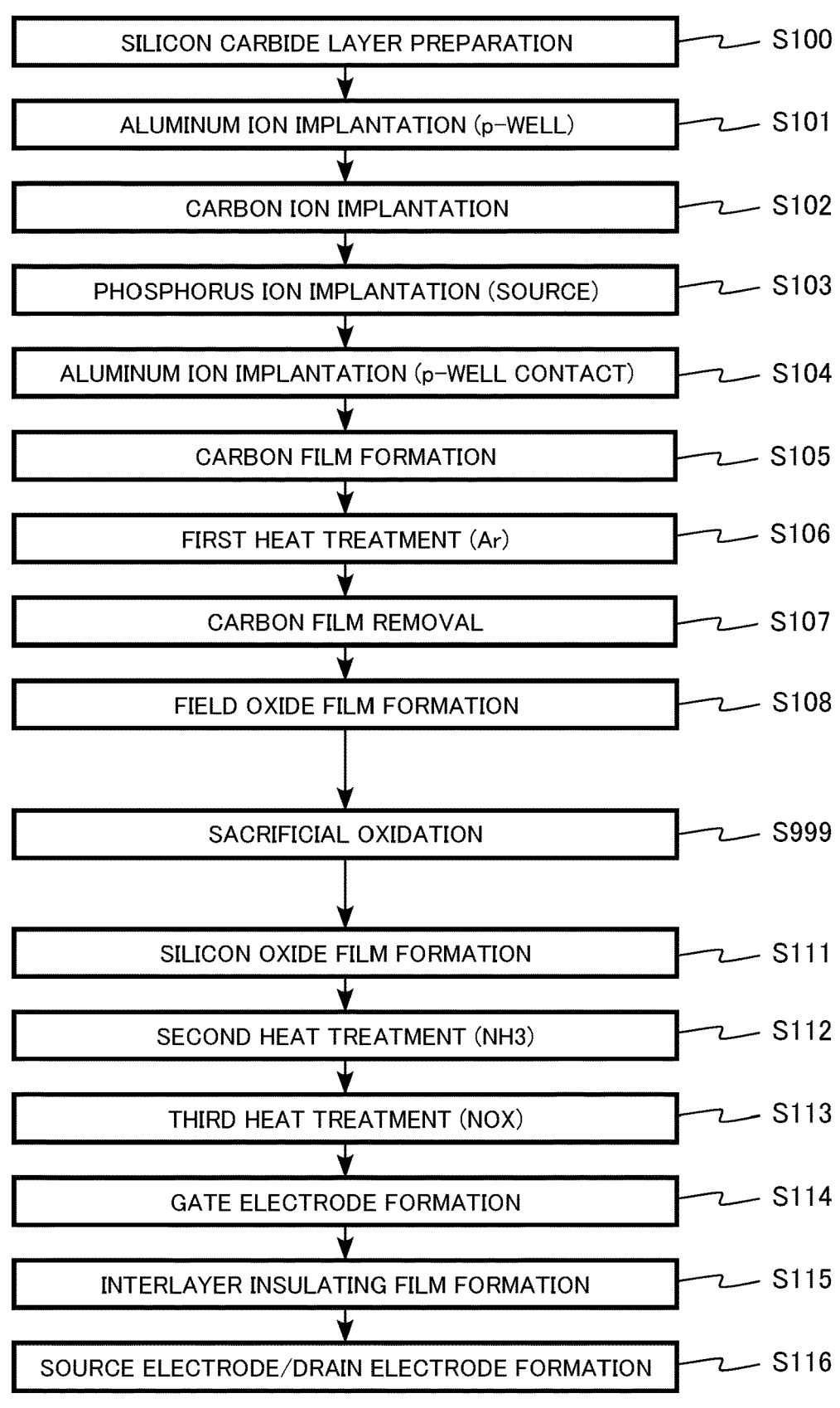

| | |
|---|---|
| SILICON CARBIDE LAYER PREPARATION | S100 |
| ALUMINUM ION IMPLANTATION (p-WELL) | S101 |
| CARBON ION IMPLANTATION | S102 |
| PHOSPHORUS ION IMPLANTATION (SOURCE) | S103 |
| ALUMINUM ION IMPLANTATION (p-WELL CONTACT) | S104 |
| CARBON FILM FORMATION | S105 |
| FIRST HEAT TREATMENT (Ar) | S106 |
| CARBON FILM REMOVAL | S107 |
| FIELD OXIDE FILM FORMATION | S108 |
| SACRIFICIAL OXIDATION | S999 |
| SILICON OXIDE FILM FORMATION | S111 |
| SECOND HEAT TREATMENT (NH3) | S112 |
| THIRD HEAT TREATMENT (NOX) | S113 |
| GATE ELECTRODE FORMATION | S114 |
| INTERLAYER INSULATING FILM FORMATION | S115 |
| SOURCE ELECTRODE/DRAIN ELECTRODE FORMATION | S116 |

FIG.24

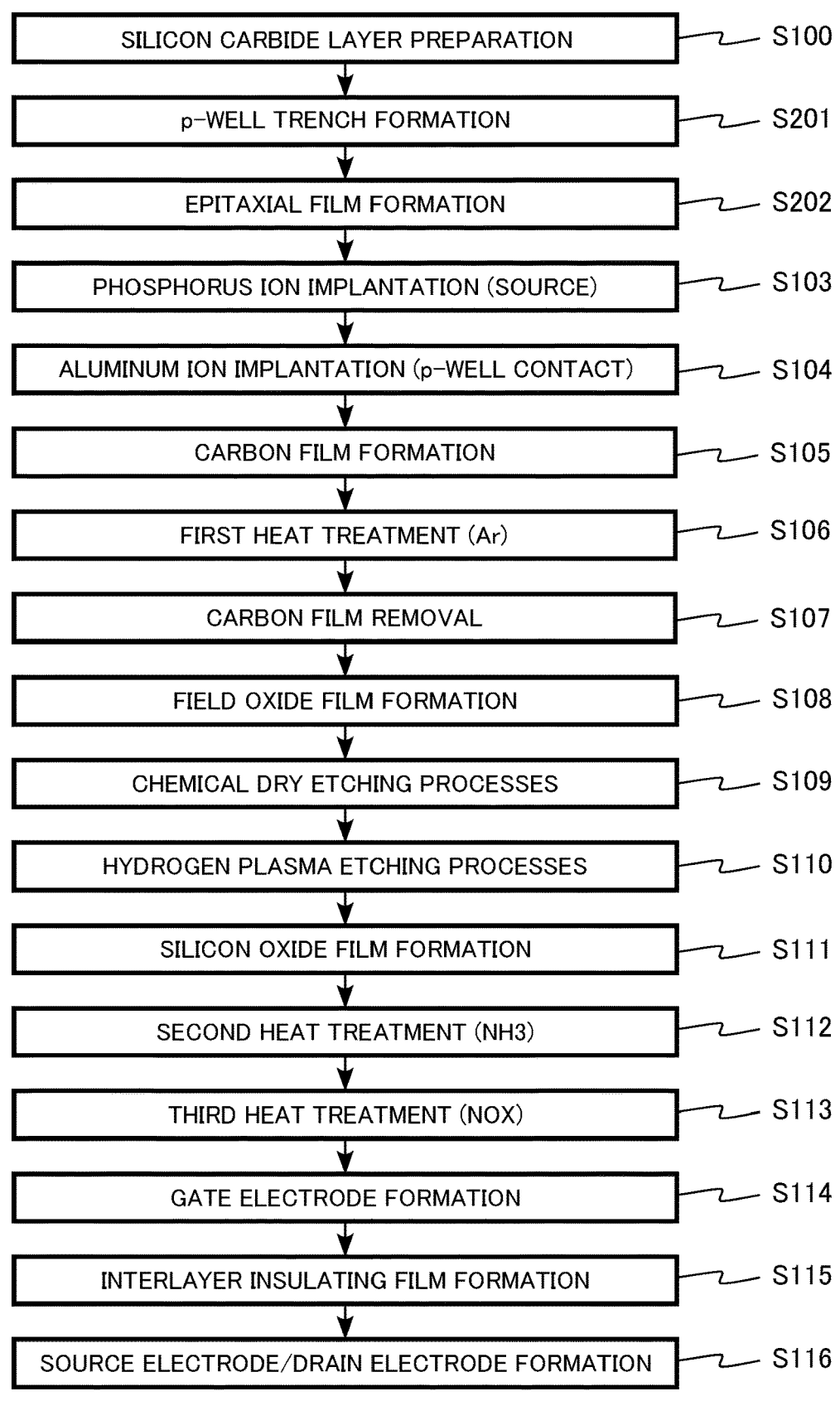

SILICON CARBIDE LAYER PREPARATION — S100 p-WELL TRENCH FORMATION — S201

EPITAXIAL FILM FORMATION — S202

PHOSPHORUS ION IMPLANTATION (SOURCE) — S103

ALUMINUM ION IMPLANTATION (p-WELL CONTACT) — S104

CARBON FILM FORMATION — S105

FIRST HEAT TREATMENT (Ar) — S106

CARBON FILM REMOVAL — S107

FIELD OXIDE FILM FORMATION — S108

CHEMICAL DRY ETCHING PROCESSES — S109

HYDROGEN PLASMA ETCHING PROCESSES — S110

SILICON OXIDE FILM FORMATION — S111

SECOND HEAT TREATMENT (NH3) — S112

THIRD HEAT TREATMENT (NOX) — S113

GATE ELECTRODE FORMATION — S114

INTERLAYER INSULATING FILM FORMATION — S115

SOURCE ELECTRODE/DRAIN ELECTRODE FORMATION — S116

FIG.29

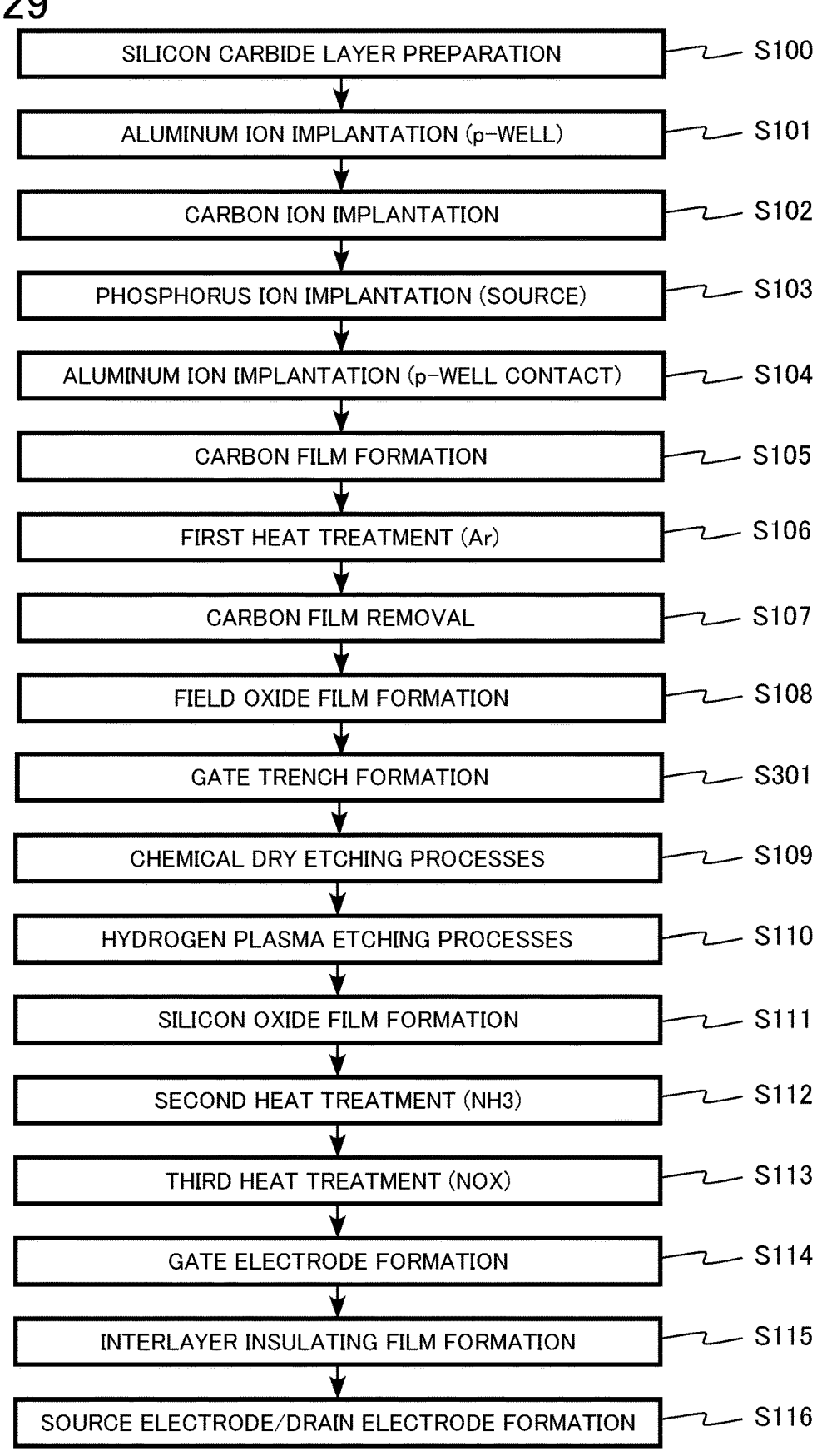

| | |
|---|---|
| SILICON CARBIDE LAYER PREPARATION | S100 |
| ALUMINUM ION IMPLANTATION (p-WELL) | S101 |
| CARBON ION IMPLANTATION | S102 |
| PHOSPHORUS ION IMPLANTATION (SOURCE) | S103 |
| ALUMINUM ION IMPLANTATION (p-WELL CONTACT) | S104 |
| CARBON FILM FORMATION | S105 |
| FIRST HEAT TREATMENT (Ar) | S106 |
| CARBON FILM REMOVAL | S107 |
| FIELD OXIDE FILM FORMATION | S108 |
| GATE TRENCH FORMATION | S301 |
| CHEMICAL DRY ETCHING PROCESSES | S109 |
| HYDROGEN PLASMA ETCHING PROCESSES | S110 |
| SILICON OXIDE FILM FORMATION | S111 |
| SECOND HEAT TREATMENT (NH3) | S112 |
| THIRD HEAT TREATMENT (NOX) | S113 |
| GATE ELECTRODE FORMATION | S114 |
| INTERLAYER INSULATING FILM FORMATION | S115 |
| SOURCE ELECTRODE/DRAIN ELECTRODE FORMATION | S116 |

FIG.35

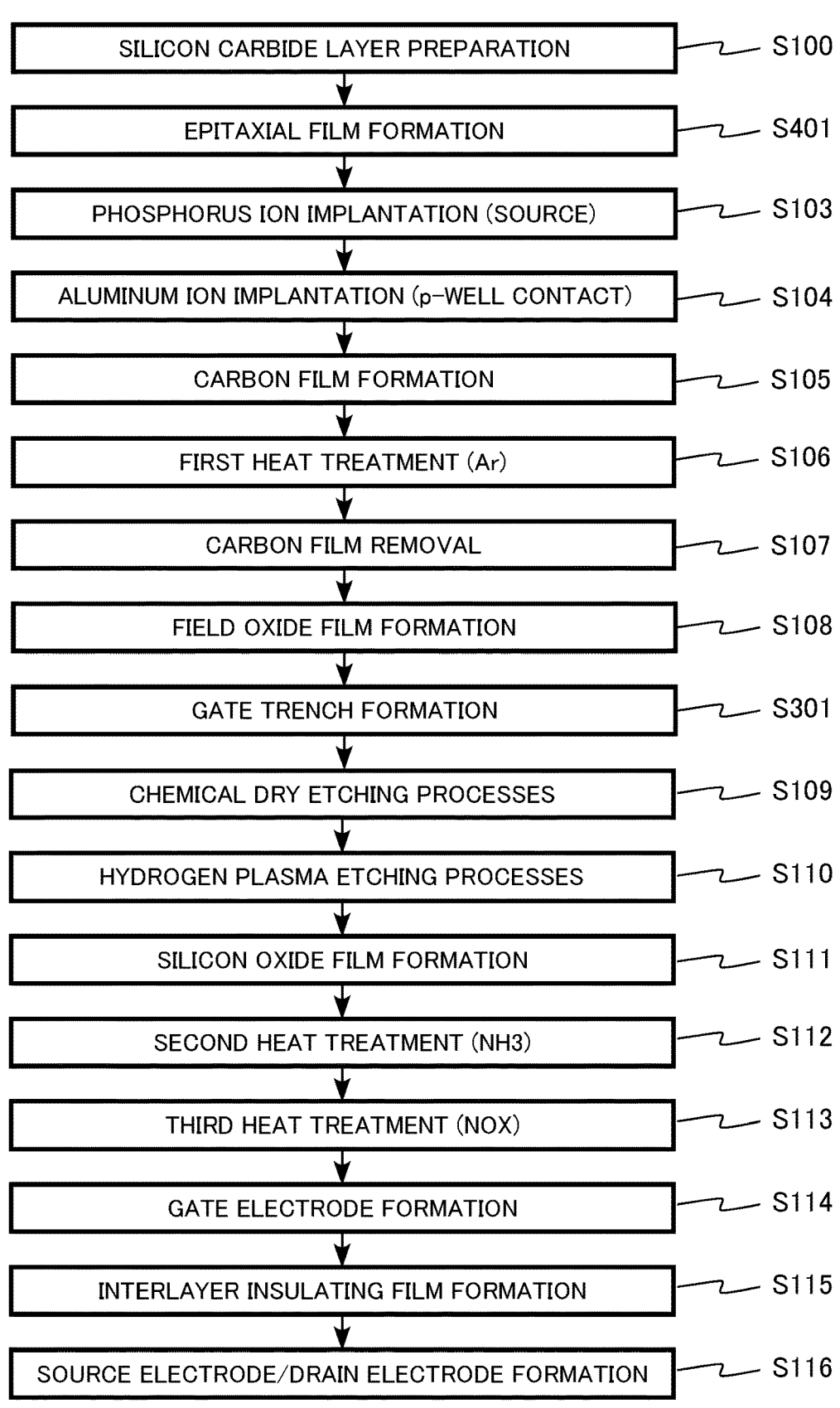

SILICON CARBIDE LAYER PREPARATION — S100

EPITAXIAL FILM FORMATION — S401

PHOSPHORUS ION IMPLANTATION (SOURCE) — S103

ALUMINUM ION IMPLANTATION (p-WELL CONTACT) — S104

CARBON FILM FORMATION — S105

FIRST HEAT TREATMENT (Ar) — S106

CARBON FILM REMOVAL — S107

FIELD OXIDE FILM FORMATION — S108

GATE TRENCH FORMATION — S301

CHEMICAL DRY ETCHING PROCESSES — S109

HYDROGEN PLASMA ETCHING PROCESSES — S110

SILICON OXIDE FILM FORMATION — S111

SECOND HEAT TREATMENT (NH3) — S112

THIRD HEAT TREATMENT (NOX) — S113

GATE ELECTRODE FORMATION — S114

INTERLAYER INSULATING FILM FORMATION — S115

SOURCE ELECTRODE/DRAIN ELECTRODE FORMATION — S116

SEMICONDUCTOR DEVICE MANUFACTURING METHOD

CROSS-REFERENCE TO RELATED APPLICATION

This application is based upon and claims the benefit of priority from Japanese Patent Application No. 2023-039307, filed on Mar. 14, 2023, the entire contents of which are incorporated herein by reference.

FIELD

Embodiments described herein relate generally to a semiconductor device manufacturing method.

BACKGROUND

Silicon carbide (SiC) is expected as a material for next-generation semiconductor devices. Silicon carbide has excellent physical properties, such as a bandgap of about 3 times, a breakdown field strength of about 10 times, and a thermal conductivity of about 3 times that of silicon (Si). By using such characteristics, it is possible to realize a semiconductor device that can operate at high temperature with low loss.

For example, when forming a metal oxide semiconductor field effect transistor (MOSFET) using silicon carbide, there is a problem that the carrier mobility decreases.

BRIEF DESCRIPTION OF THE DRAWINGS

FIG. 3 is a process flow diagram of the semiconductor device manufacturing method according to the first embodiment;

FIG. 20 is a process flow diagram of a semiconductor device manufacturing method according to a comparative example;

FIG. 24 is a process flow diagram of a semiconductor device manufacturing method according to a second embodiment;

FIG. 29 is a process flow diagram of the semiconductor device manufacturing method according to the third embodiment;

FIG. 35 is a process flow diagram of a semiconductor device manufacturing method according to a fourth embodiment;

DETAILED DESCRIPTION

Figure 1:
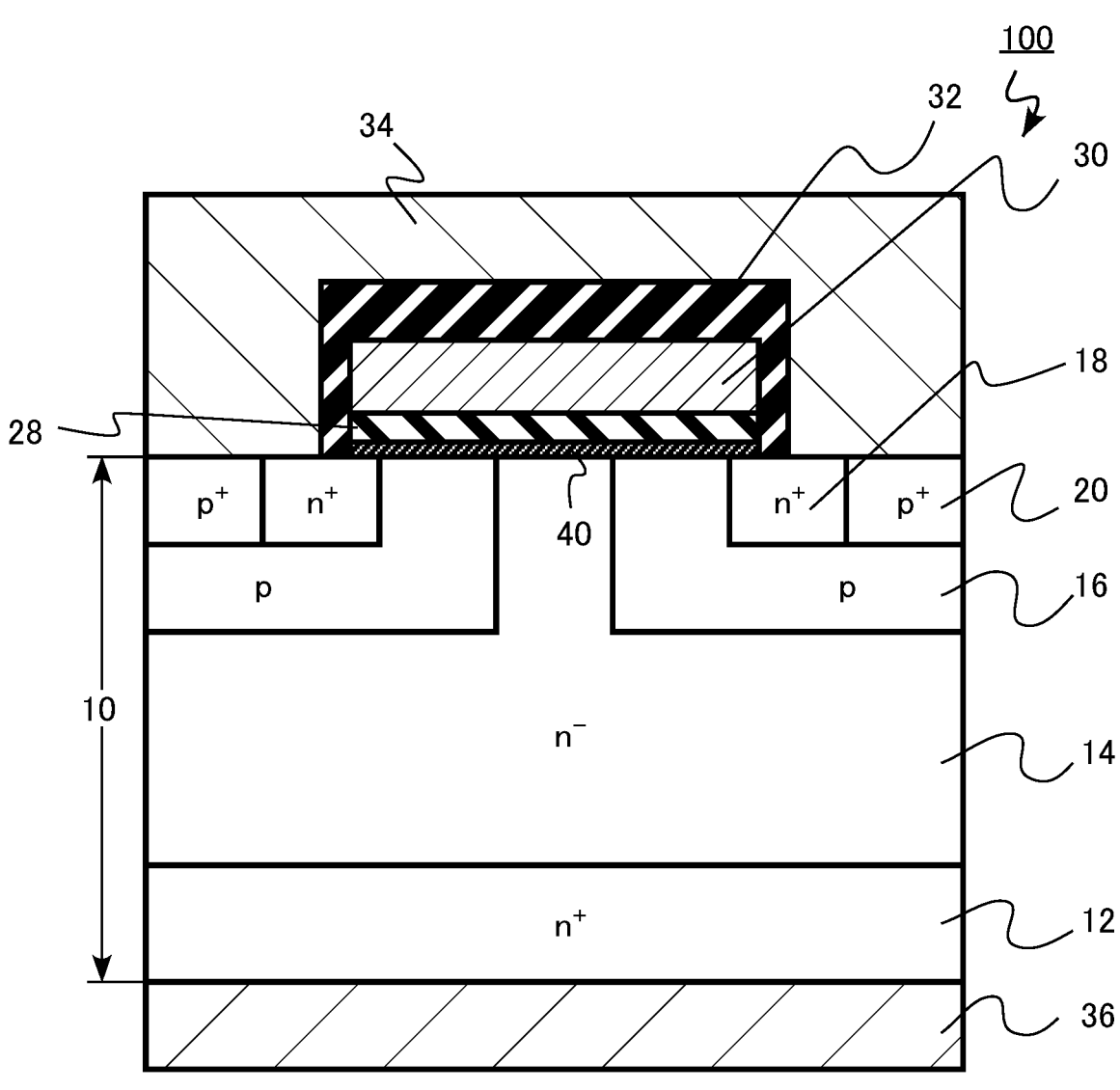
FIG. 1 is a schematic cross-sectional view of a semiconductor device manufactured by a semiconductor device manufacturing method according to a first embodiment.

A semiconductor device manufacturing method of embodiments includes: performing a first ion implantation implanting aluminum into a silicon carbide layer with a first dose amount; performing a first heat treatment at a temperature equal to or more than 1600° C.; performing a first etching process etching a surface of the silicon carbide layer in an atmosphere containing plasma generated from a gas containing halogen and oxygen; performing a second etching process etching the surface in an atmosphere containing hydrogen plasma or atomic hydrogen; forming a silicon oxide film on the surface; and forming a gate electrode on the silicon oxide film.

Hereinafter, embodiments will be described with reference to the diagrams. In addition, in the following description, the same or similar members and the like are denoted by the same reference numerals, and the description of the members and the like once described will be omitted as appropriate.

In addition, in the following description, when there are notations of $n^+$, $n$, $n^-$, $p^+$, $p$, and $p^-$, these indicate the relative high and low of the impurity concentration in each conductive type. That is, $n^+$ indicates that the n-type impurity concentration is relatively higher than $n$, and $n^-$ indicates that the n-type impurity concentration is relatively lower than $n$. In addition, $p^+$ indicates that the p-type impurity concentration is relatively higher than $p$, and $p^-$ indicates that the p-type impurity concentration is relatively lower than $p$. In addition, $n^+$-type and $n^-$-type may be simply described as n-type, $p^+$-type and $p^-$-type may be simply described as p-type. Unless otherwise specified, the impurity concentration in each region is represented by, for example, the value of the impurity concentration in the central portion of each region.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated by, for example, SIMS. In addition, the distance such as the width or depth of an impurity region can be calculated from, for example, an SCM image.

The depth of a trench, the thickness of an insulating layer, and the like can be measured, for example, on the profile of SIMS, the image of a transmission electron microscope (TEM), or the image of a scanning electron microscope (SEM).

First Embodiment

A semiconductor device manufacturing method according to a first embodiment includes: performing a first ion implantation implanting aluminum into a silicon carbide layer with a first dose amount; performing a first heat treatment at a temperature equal to or more than 1600° C.; performing a first etching process etching a surface of the silicon carbide layer in an atmosphere containing plasma generated from a gas containing halogen and oxygen; performing a second etching process etching the surface in an atmosphere containing hydrogen plasma or atomic hydrogen; forming a silicon oxide film on the surface; and forming a gate electrode on the silicon oxide film.

FIG. 1 is a schematic cross-sectional view of a semiconductor device manufactured by the semiconductor device manufacturing method according to the first embodiment. The semiconductor device is a MOSFET 100. The MOSFET 100 is a double implantation MOSFET (DIMOSFET) in which a p-well and a source region are formed by ion implantation. In addition, the MOSFET 100 is an n-channel MOSFET having electrons as carriers.

The MOSFET 100 includes a silicon carbide layer 10, a gate insulating layer 28, a gate electrode 30, an interlayer insulating film 32, a source electrode 34, a drain electrode 36, and an interface termination region 40.

The silicon carbide layer 10 includes a drain region 12, a drift region 14, a p-well region 16, a source region 18, and a p-well contact region 20.

The silicon carbide layer 10 is, for example, a single crystal of 4H—SiC. The silicon carbide layer 10 is disposed between the source electrode 34 and the drain electrode 36.

Figure 2:
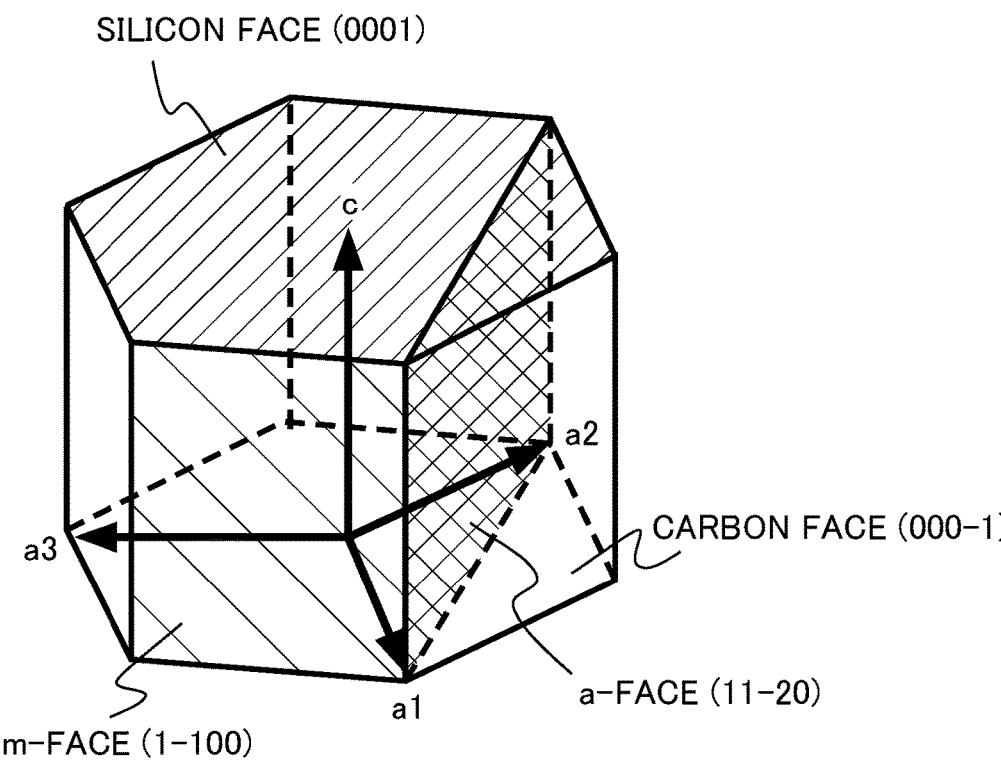
FIG. 2 is a diagram showing a crystal structure of an SiC semiconductor.

FIG. 2 is a diagram showing the crystal structure of an SiC semiconductor. A typical crystal structure of the SiC semiconductor is a hexagonal crystal system such as 4H—SiC. One of the faces (top surface of the hexagonal column) whose normal line is a c-axis along the axial direction of the hexagonal column is a (0001) face. The face equivalent to the (0001) face is referred to as a silicon face (Si face) and denoted as a {0001} face. Silicon atoms (Si) are arranged on the outermost surface of the silicon face.

The other side of the face (top face of the hexagonal column) whose normal line is the c-axis along the axial direction of the hexagonal column is a (000-1) face. The face equivalent to the (000-1) face is referred to as a carbon face (C face) and denoted as a {000-1} face. Carbon atoms (C) are arranged on the outermost surface of the carbon face.

On the other hand, the side surface (pillar surface) of the hexagonal column is an m-face that is a face equivalent to the (1-100) face, that is, a {1-100} face. In addition, the face passing through a pair of non-adjacent ridge lines is an a-face that is a face equivalent to the (11-20) face, that is, a {11-20} face. Both silicon atoms (Si) and carbon atoms (C) are arranged on the outermost surfaces of the m-face and the a-face.

Hereinafter, a case where the surface of the silicon carbide layer 10 is a face inclined by an angle equal to or more than 0° and equal to or less than 8° with respect to the silicon face and the back surface of the silicon carbide layer 10 is a face inclined by an angle equal to or more than 0° and equal to or less than 8° with respect to the carbon face will be described as an example. The surface of the silicon carbide layer 10 has an off angle equal to or more than 0° and equal to or less than 8° with respect to the silicon face.

The drain region 12 is an $n^+$-type SiC. The drain region 12 contains, for example, nitrogen (N) as an n-type impurity. The n-type impurity concentration in the drain region 12 is, for example, equal to or more than $1 \times 10^{18}$ cm$^{-3}$ and equal to or less than $1 \times 10^{21}$ cm$^{-3}$.

The drift region 14 is provided on the drain region 12. The drift region 14 is an $n^-$-type SiC. The drift region 14 contains, for example, nitrogen as an n-type impurity.

The n-type impurity concentration in the drift region 14 is lower than the n-type impurity concentration in the drain region 12. The n-type impurity concentration in the drift region 14 is, for example, equal to or more than $1 \times 10^{15}$ cm$^{-3}$ and equal to or less than $2 \times 10^{16}$ cm$^{-3}$. The drift region 14 is, for example, an SiC epitaxial growth layer formed on the drain region 12 by using an epitaxial growth method.

The thickness of the drift region 14 is, for example, equal to or more than 5 μm and equal to or less than 100 μm.

The p-well region 16 is provided on a partial surface of the drift region 14. The p-well region 16 is disposed between the drift region 14 and the gate insulating layer 28. The p-well region 16 is a p-type SiC.

The p-well region 16 contains, for example, aluminum (Al) as a p-type impurity. The p-type impurity concentration in the p-well region 16 is, for example, equal to or more than $1 \times 10^{16}$ cm$^{-3}$ and equal to or less than $1 \times 10^{20}$ cm$^{-3}$.

The depth of the p-well region 16 is, for example, equal to or more than 0.4 μm and equal to or less than 0.8 μm. The p-well region 16 functions as a channel region of the MOSFET 100. A portion of the p-well region 16 facing gate electrode 30 functions as a channel region.

The carbon vacancy density of the p-well region 16 is, for example, equal to or less than $1 \times 10^{12}$ cm$^{-3}$. The Hall mobility of electrons in the p-well region 16 is, for example, equal to or more than 200 cm$^2$/V·s.

The source region 18 is provided on a partial surface of the p-well region 16. The source region 18 is an n$^+$-type SiC. The source region 18 contains, for example, phosphorus (P) as an n-type impurity. The n-type impurity concentration in the source region 18 is, for example, equal to or more than $1 \times 10^{18}$ cm$^{-3}$ and equal to or less than $1 \times 10^{22}$ cm$^{-3}$.

The depth of the source region 18 is smaller than the depth of the p-well region 16. The depth of the source region 18 is, for example, equal to or more than 0.2 μm and equal to or less than 0.4 μm.

The p-well contact region 20 is provided on a partial surface of the p-well region 16. The p-well contact region 20 is provided on the side of the source region 18. The p-well contact region 20 is a p$^+$-type SiC.

The p-well contact region 20 contains, for example, aluminum as a p-type impurity. The p-type impurity concentration in the p-well contact region 20 is, for example, equal to or more than $1 \times 10^{18}$ cm$^{-3}$ and equal to or less than $1 \times 10^{22}$ cm$^{-3}$.

The depth of the p-well contact region 20 is smaller than the depth of the p-well region 16. The depth of the p-well contact region 20 is, for example, equal to or more than 0.2 μm and equal to or less than 0.4 μm.

The gate insulating layer 28 is provided between the silicon carbide layer 10 and the gate electrode 30. The gate insulating layer 28 is provided between the drift region 14 and the gate electrode 30 and between the p-well region 16 and the gate electrode 30. The gate insulating layer 28 is provided above the drift region 14 and the p-well region 16. The gate insulating layer 28 is continuously formed on the surfaces of the drift region 14 and the p-well region 16.

The gate insulating layer 28 contains silicon oxide. The gate insulating layer 28 is an example of the silicon oxide layer.

The thickness of the gate insulating layer 28 is, for example, equal to or more than 30 nm and equal to or less than 100 nm. The gate insulating layer 28 functions as a gate insulating layer of the MOSFET 100.

The interface termination region 40 is disposed between the silicon carbide layer 10 and the gate insulating layer 28. The interface termination region 40 is disposed between the drift region 14 and the gate insulating layer 28 and between the p-well region 16 and the gate insulating layer 28. The interface termination region 40 contains nitrogen (N) as a termination element for terminating the dangling bond of the silicon carbide layer 10. The interface termination region 40 is an example of the region.

The concentration of nitrogen in the interface termination region 40 is, for example, equal to or more than $1 \times 10^{21}$ cm$^{-3}$.

Nitrogen atoms present in the interface termination region 40 terminate the dangling bonds on the surface of the silicon carbide layer 10.

The gate electrode 30 is provided on the gate insulating layer 28. The gate insulating layer 28 is interposed between the gate electrode 30 and the silicon carbide layer 10. The gate insulating layer 28 is interposed between the gate electrode 30 and the drift region 14. The gate insulating layer 28 is interposed between the gate electrode 30 and the p-well region 16.

The gate electrode 30 is, for example, polycrystalline silicon containing n-type impurities or p-type impurities.

The interlayer insulating film 32 is formed on the gate electrode 30. The interlayer insulating film 32 is disposed between the gate electrode 30 and the source electrode 34. The interlayer insulating film 32 is, for example, a silicon oxide film.

The source electrode 34 is electrically connected to the source region 18 and the p-well contact region 20. The source electrode 34 also functions as a p-well electrode for applying an electric potential to the p-well region 16. The source electrode 34 is in contact with, for example, the source region 18 and the p-well contact region 20.

The source electrode 34 has, for example, a stacked structure of a barrier metal layer of nickel (Ni) and a metal layer of aluminum on the barrier metal layer. The barrier metal layer of nickel and the silicon carbide layer may react with each other to form nickel silicide (NiSi, Ni$_2$Si, and the like). The barrier metal layer formed of nickel and the metal layer formed of aluminum may form an alloy by reaction.

The drain electrode 36 is provided on a side of the silicon carbide layer 10 opposite to the source electrode 34, that is, on the back surface side of the silicon carbide layer 10. The drain electrode 36 is electrically connected to the drain region 12. The drain electrode 36 is in contact with, for example, the drain region 12.

The drain electrode 36 is, for example, nickel. Nickel may react with the drain region 12 to form nickel silicide (NiSi, Ni$_2$Si, and the like).

In addition, in the first embodiment, the n-type impurity is, for example, nitrogen or phosphorus. Arsenic (As) or antimony (Sb) can also be applied as an n-type impurity.

In addition, in the first embodiment, the p-type impurity is, for example, aluminum. Boron (B), gallium (Ga), and indium (In) can also be applied as p-type impurities.

Next, an example of the semiconductor device manufacturing method according to the first embodiment will be described.

FIG. 3 is a process flow diagram of the semiconductor device manufacturing method according to the first embodiment. FIGS. 4 to 18 are explanatory diagrams of the semiconductor device manufacturing method according to the first embodiment. FIGS. 4 to 6 and 8 to 18 are cross-sectional views during manufacturing. FIG. 7 is a diagram showing the element distribution immediately after ion implantation.

As shown in FIG. 3, the semiconductor device manufacturing method according to the first embodiment includes silicon carbide layer preparation (step S100), aluminum ion implantation (step S101), carbon ion implantation (step S102), phosphorus ion implantation (step S103), aluminum ion implantation (step S104), carbon film formation (step S105), first heat treatment (step S106), carbon film removal (step S107), field oxide film formation (step S108), chemical dry etching process (step S109), hydrogen plasma etching process (step S110), silicon oxide film formation (step S111), second heat treatment (step S112), third heat treatment (step S113), gate electrode formation (step S114), interlayer insulating film formation (step S115), and source electrode/drain electrode formation (step S116).

Figure 4:
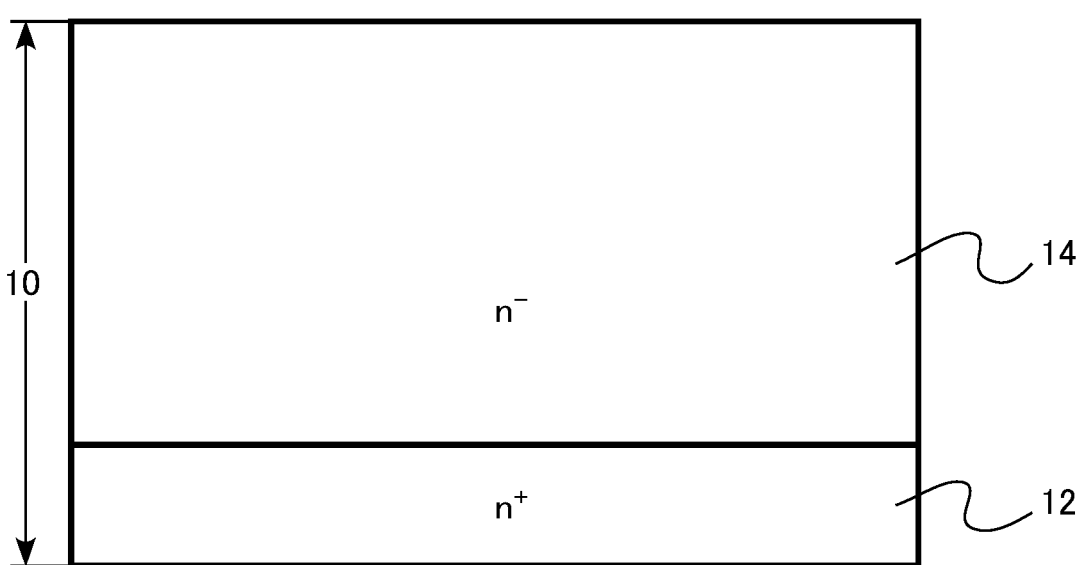
FIG. 4 is an explanatory diagram of the semiconductor device manufacturing method according to the first embodiment.

In step S100, the n-type silicon carbide layer 10 is prepared (FIG. 4). The silicon carbide layer 10 includes an n$^+$-type drain region 12 and an n$^-$-type drift region 14. The drift region 14 is formed on the drain region 12 by using an epitaxial growth method, for example.

The drain region 12 contains nitrogen as an n-type impurity. The n-type impurity concentration in the drain region 12 is, for example, equal to or more than $1 \times 10^{18}$ cm$^{-3}$ and equal to or less than $1 \times 10^{21}$ cm$^{-3}$.

The drift region 14 contains nitrogen as an n-type impurity. The n-type impurity concentration in the drift region 14 is, for example, equal to or more than $1 \times 10^{15}$ cm$^{-3}$ and equal to or less than $2 \times 10^{16}$ cm$^{-3}$. The thickness of the drift region 14 is, for example, equal to or more than 5 μm and equal to or less than 100 μm.

Figure 5:
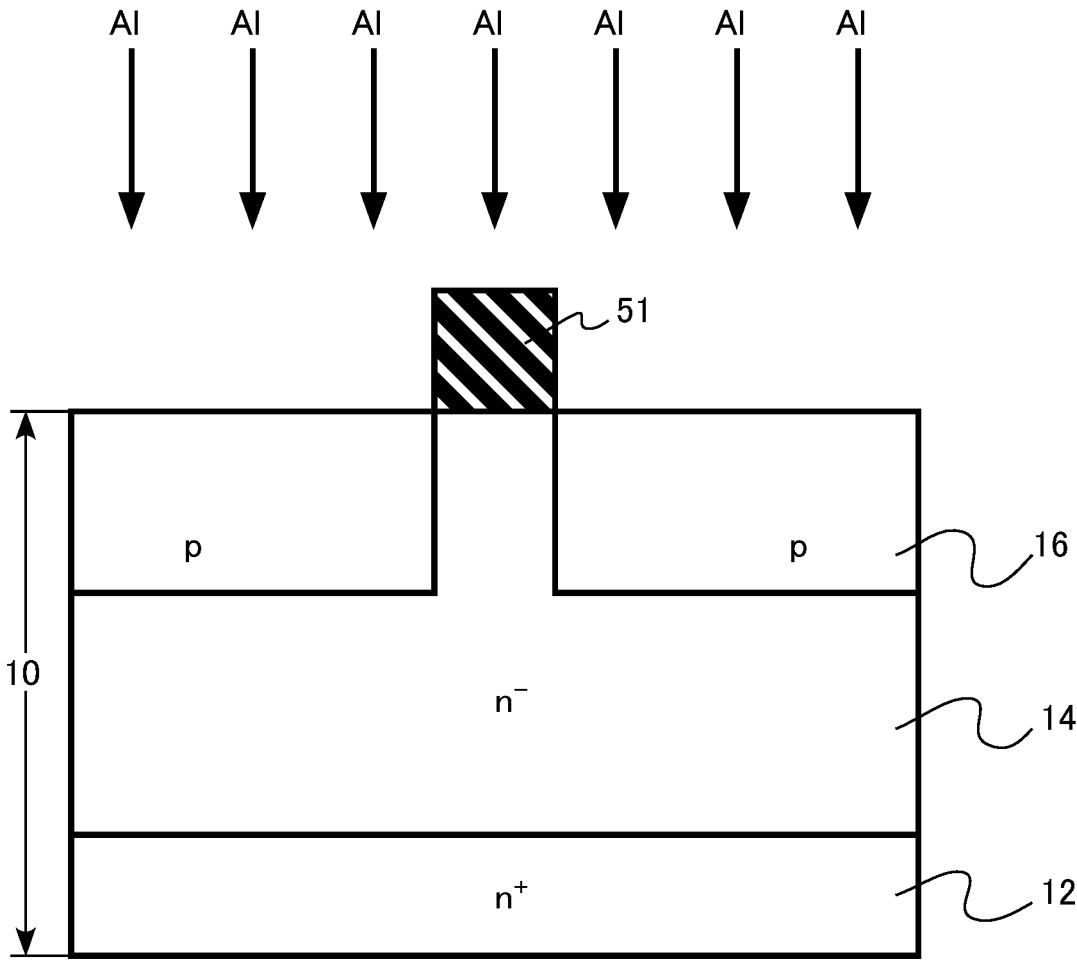
FIG. 5 is an explanatory diagram of the semiconductor device manufacturing method according to the first embodiment.

In step S101, a first mask material 51 is formed, for example, by forming an insulating film and patterning the insulating film by photolithography and etching. Then, by using the first mask material 51 as an ion implantation mask, aluminum is ion-implanted into the drift region 14. The p-well region 16 is formed by ion implantation (FIG. 5).

Ion implantation for forming the p-well region 16 is an example of the first ion implantation. Aluminum ion implantation is performed in a first projected range with a first dose amount. The projected range is an average projection range.

The first projected range is, for example, equal to or more than 0.1 μm and equal to or less than 0.6 μm. The first dose amount is, for example, equal to or more than $1 \times 10^{12}$ cm$^{-2}$ and equal to or less than $1 \times 10^{14}$ cm$^{-2}$.

Figure 6:
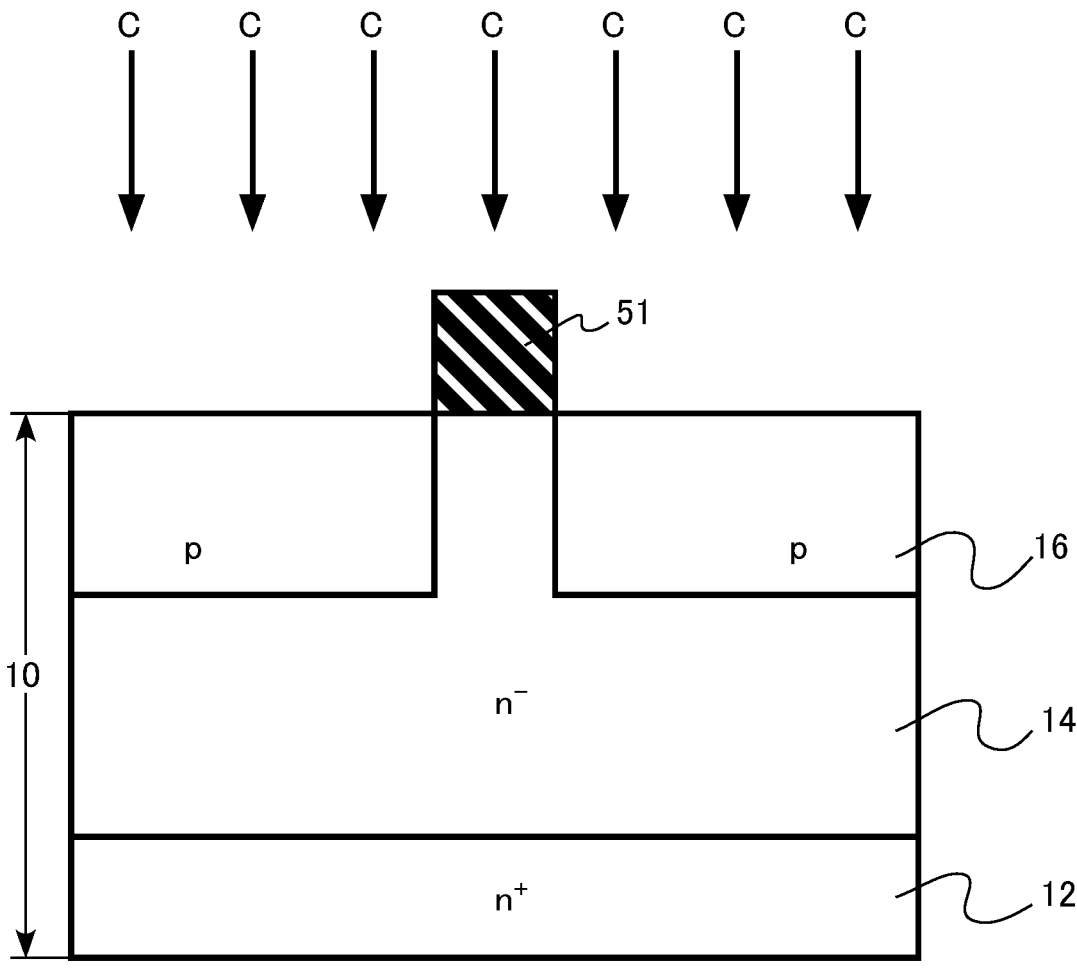
FIG. 6 is an explanatory diagram of the semiconductor device manufacturing method according to the first embodiment.
Figure 7:
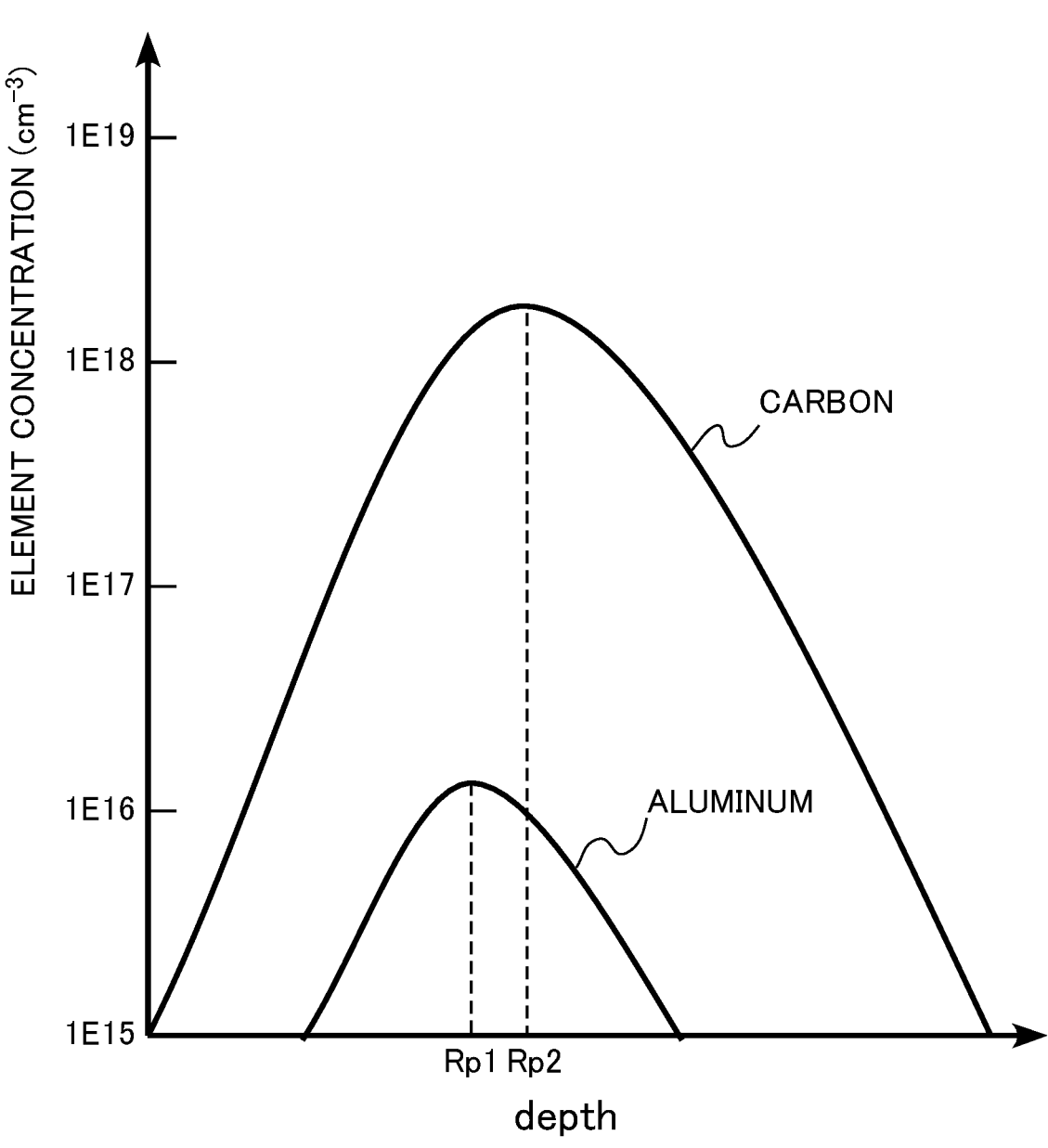
FIG. 7 is an explanatory diagram of the semiconductor device manufacturing method according to the first embodiment.

In step S102, carbon is ion-implanted into the p-well region 16 by using the first mask material 51 as an ion implantation mask (FIG. 6). Carbon ion implantation into the p-well region 16 is an example of the second ion implantation. Carbon ion implantation is performed in a second projected range with a second dose amount. Thereafter, the first mask material 51 is removed.

The second projected range is, for example, equal to or more than 0.1 μm and equal to or less than 0.6 μm. The second projected range is, for example, equal to or more than 80% and equal to or less than 120% of the first projected range. The second dose amount is equal to or more than 10 times the first dose amount. The second dose amount is, for example, equal to or less than 10000 times the first dose amount. The second dose amount is, for example, equal to or more than $1 \times 10^{15}$ cm$^{-2}$ and equal to or less than $1 \times 10^{18}$ cm$^{-2}$.

FIG. 7 shows the concentration distribution of aluminum implanted into the silicon carbide layer 10 by the first ion implantation and the concentration distribution of carbon implanted into the silicon carbide layer 10 by the second ion implantation. FIG. 7 shows the element distribution immediately after ion implantation.

As shown in FIG. 7, a second projected range Rp2 for carbon ion implantation is disposed in the vicinity of the first projected range Rp1 for aluminum ion implantation. Since the second dose amount of carbon ion implantation is equal to or more than 10 times the first dose amount of aluminum ion implantation, the carbon concentration distribution after ion implantation completely covers, for example, the aluminum concentration distribution after ion implantation. At each depth after ion implantation, the concentration of carbon present between lattices is higher than the concentration of aluminum present between lattices.

The peak concentration of the aluminum distribution is, for example, equal to or more than $1 \times 10^{16}$ cm$^{-3}$ and equal to or less than $1 \times 10^{20}$ cm$^{-3}$. The peak concentration of the carbon distribution is, for example, equal to or more than $1 \times 10^{18}$ cm$^{-3}$ and equal to or less than $1 \times 10^{22}$ cm$^{-3}$.

Figure 8:
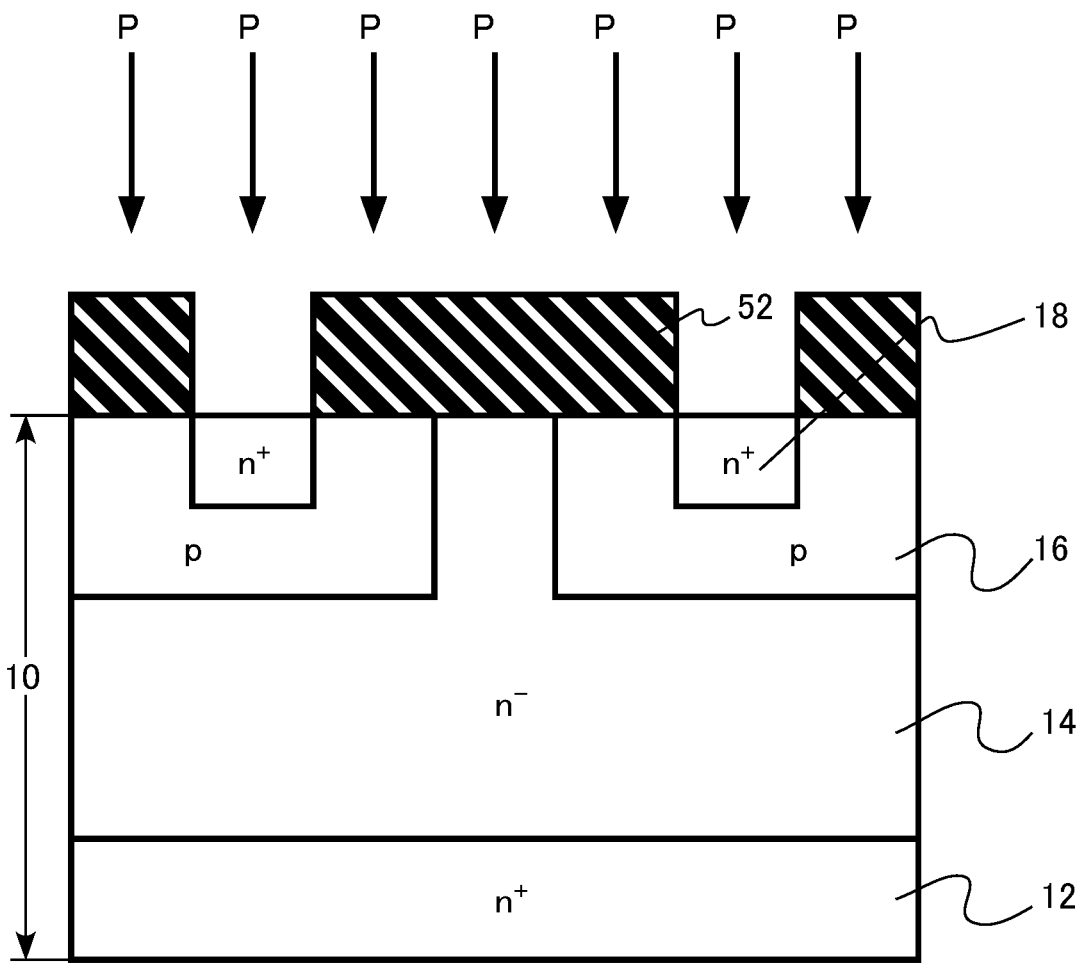
FIG. 8 is an explanatory diagram of the semiconductor device manufacturing method according to the first embodiment.

In step S103, a second mask material 52 is formed, for example, by forming an insulating film and patterning the insulating film by photolithography and etching. Then, by using the second mask material 52 as an ion implantation mask, phosphorus (P) is ion-implanted into the drift region 14 to form the source region 18 (FIG. 8). Thereafter, the second mask material 52 is removed.

Figure 9:
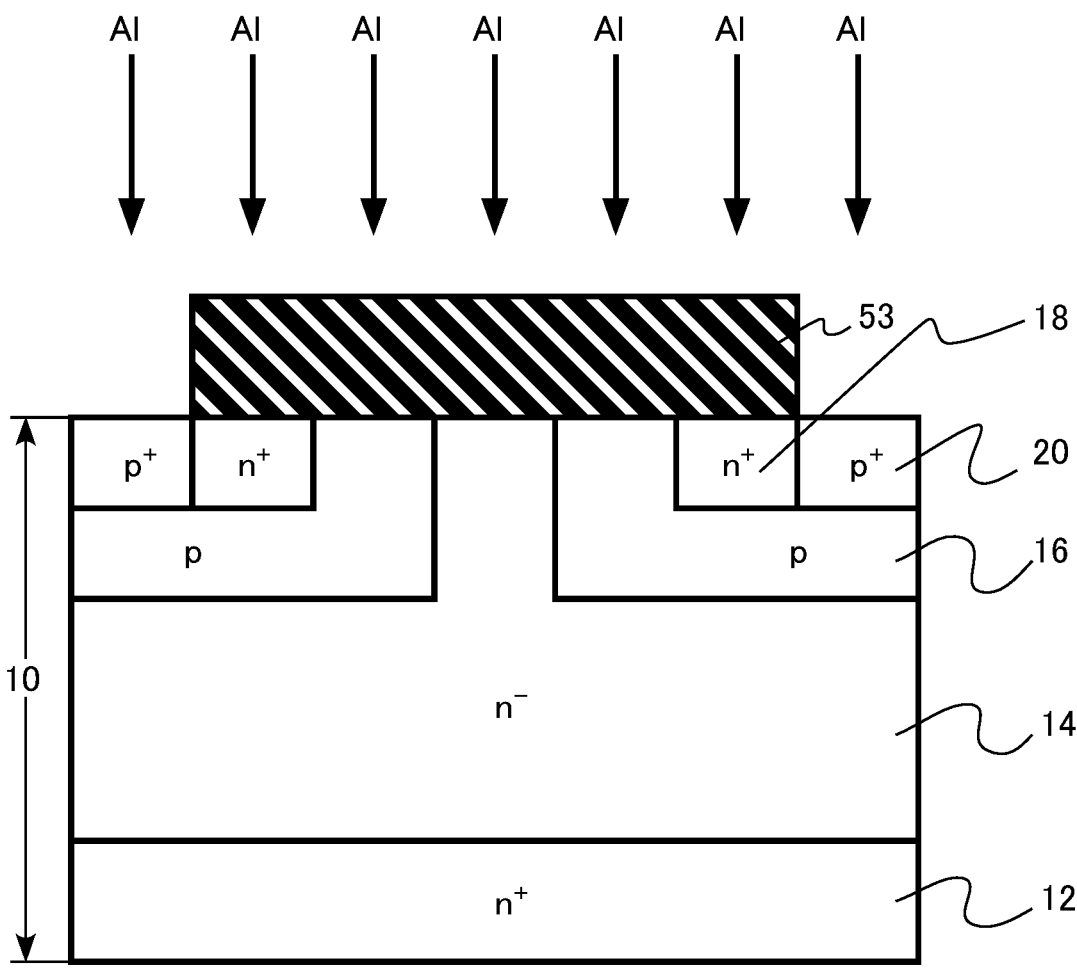
FIG. 9 is an explanatory diagram of the semiconductor device manufacturing method according to the first embodiment.

In step S104, a third mask material 53 is formed, for example, by forming an insulating film and patterning the insulating film by photolithography and etching. By using the third mask material 53 as an ion implantation mask, aluminum is ion-implanted into the drift region 14 to form the p-well contact region 20 (FIG. 9).

Figure 10:
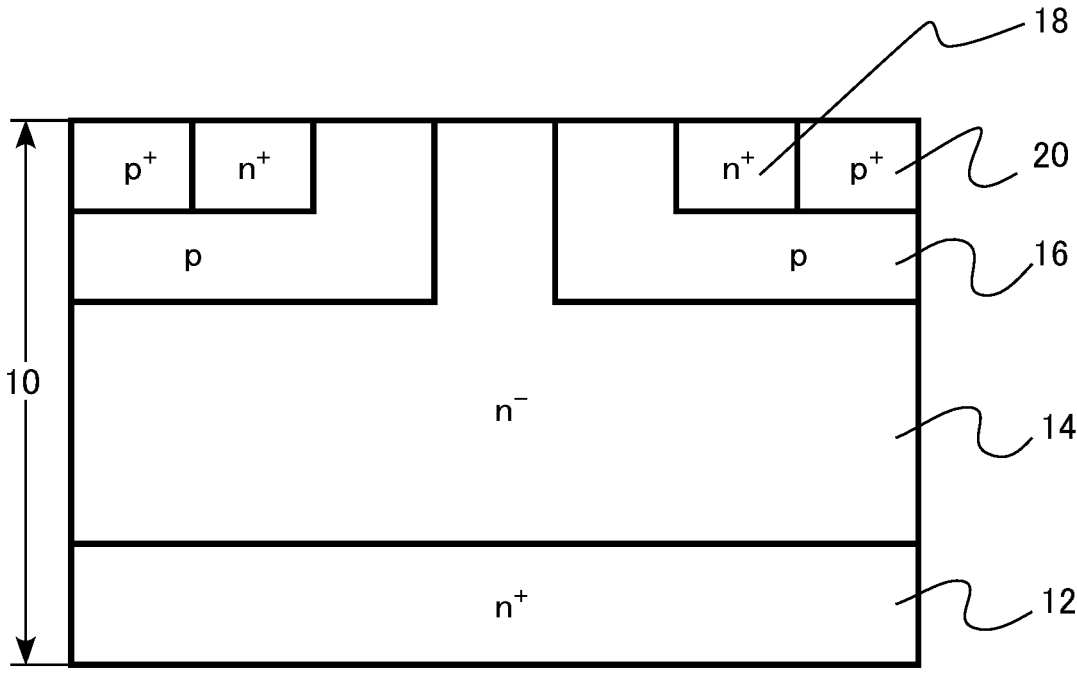
FIG. 10 is an explanatory diagram of the semiconductor device manufacturing method according to the first embodiment.

Then, the third mask material 53 is removed (FIG. 10).

Figure 11:
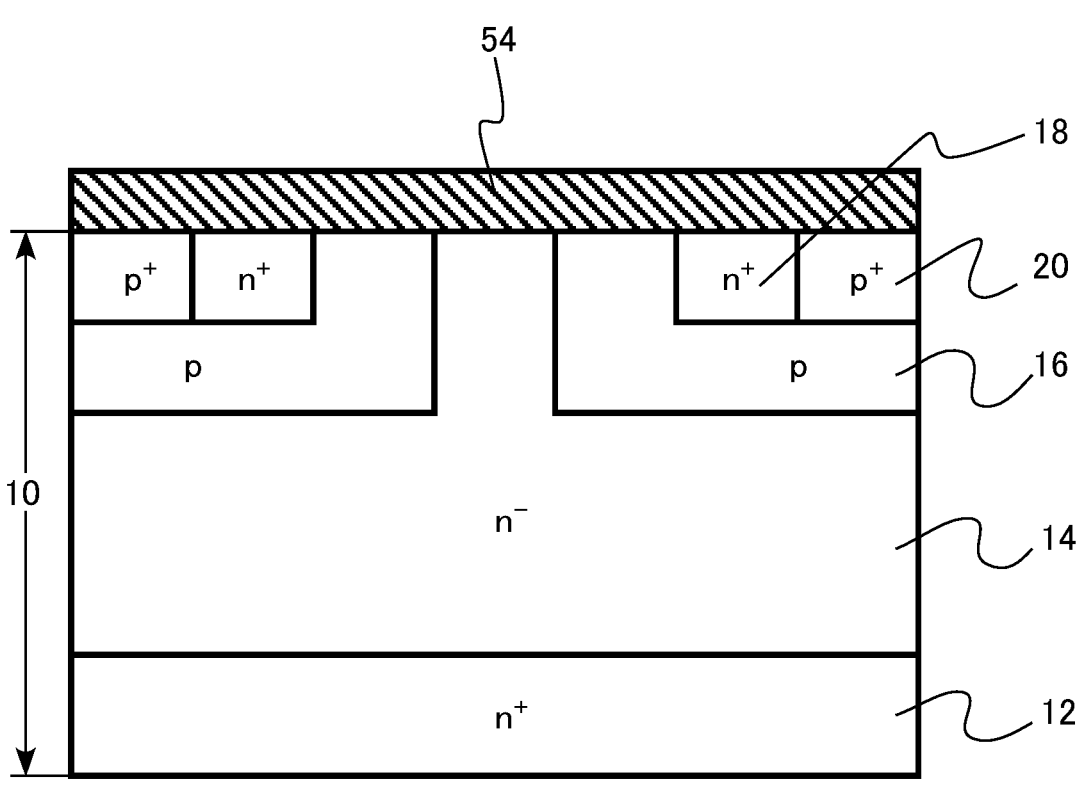
FIG. 11 is an explanatory diagram of the semiconductor device manufacturing method according to the first embodiment.

In step S105, a carbon film 54 is formed on the silicon carbide layer 10 (FIG. 11).

In step S106, first heat treatment is performed. The first heat treatment is performed at a temperature equal to or more than 1600° C. The first heat treatment is performed at a temperature equal to or less than 2000° C., for example. The first heat treatment is performed in a non-oxidizing atmosphere. The first heat treatment is performed, for example, in an inert gas atmosphere. The first heat treatment is performed, for example, in an argon gas atmosphere.

By the first heat treatment, aluminum and phosphorus ion-implanted into the silicon carbide layer 10 are activated. The first heat treatment is the activation annealing of aluminum and phosphorus. In addition, by the first heat treatment, the interstitial carbon formed by carbon ion implantation into the silicon carbide layer 10 fills the carbon vacancies in the silicon carbide layer 10.

The carbon film 54 suppresses the desorption of silicon or carbon from the silicon carbide layer 10 into the atmosphere during the first heat treatment. In addition, the carbon film 54 absorbs excess interstitial carbon in the silicon carbide layer 10 during the first heat treatment.

The first heat treatment includes, for example, a first step whose temperature is equal to or more than 1600° C. and a second step whose temperature is lower than the temperature of the first step. The temperature of the second step is, for example, equal to or less than 1000° C.

For example, in the first step, aluminum and phosphorus ion-implanted into the silicon carbide layer 10 are activated, so that the interstitial carbon fills the carbon vacancies. For example, in the second step of low temperature, excess interstitial carbon is expelled from the silicon carbide layer 10 and absorbed by the carbon film 54.

Figure 12:
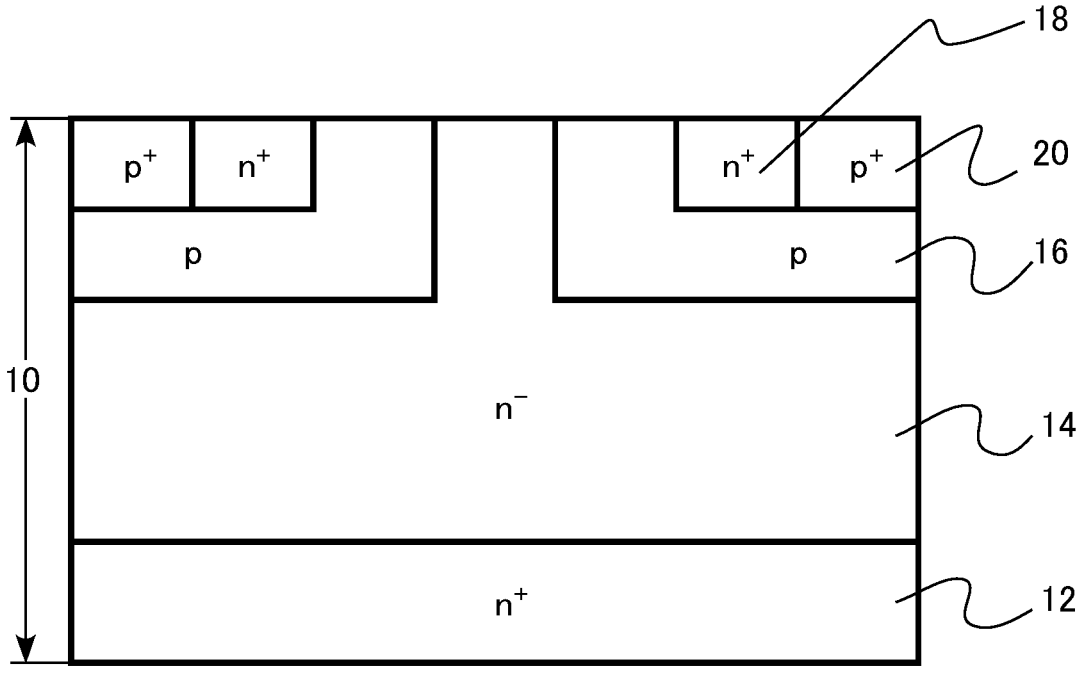
FIG. 12 is an explanatory diagram of the semiconductor device manufacturing method according to the first embodiment.

In step S107, the carbon film 54 is removed (FIG. 12). The carbon film 54 is removed by ashing process using oxygen plasma. The carbon film 54 is removed in oxygen plasma.

Figure 13:
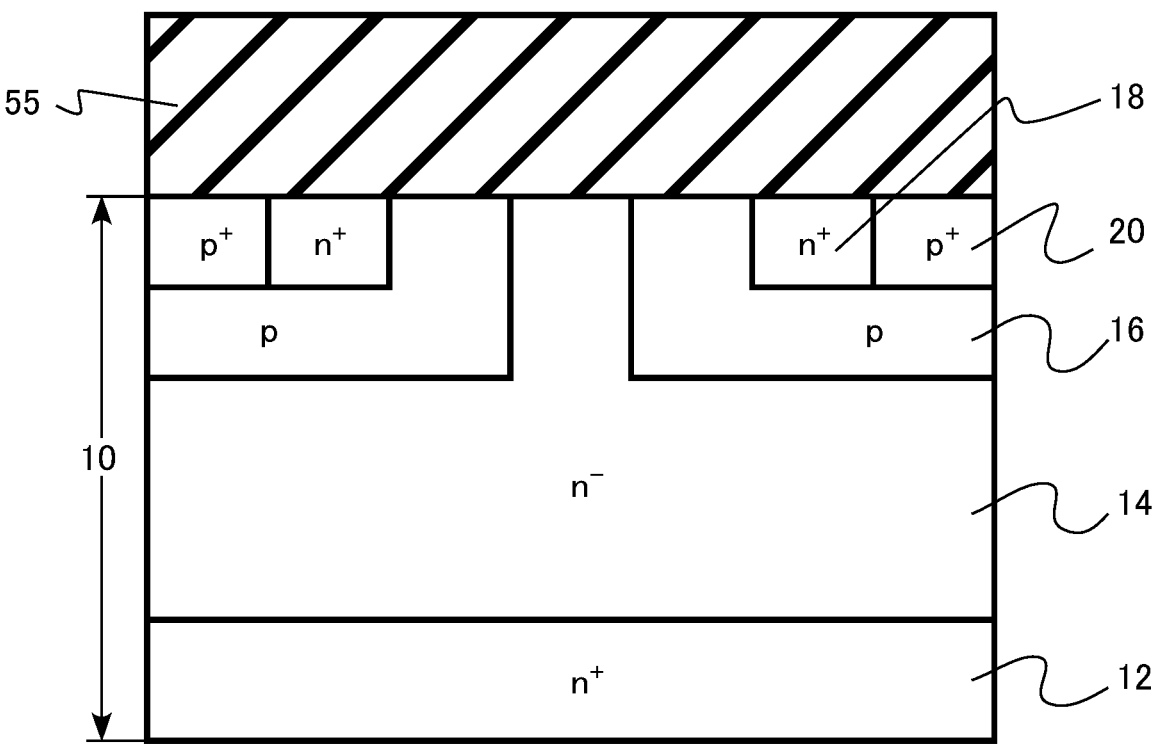
FIG. 13 is an explanatory diagram of the semiconductor device manufacturing method according to the first embodiment.

In step S108, a field oxide film 55 is formed on the silicon carbide layer 10 (FIG. 13). The field oxide film 55 contains oxygen. The field oxide film 55 is, for example, a silicon oxide film. The field oxide film 55 is deposited by using a vapor deposition method, for example. The field oxide film 55 is formed by using, for example, a chemical vapor deposition method (CVD method) or a physical vapor deposition method (PVD method).

The field oxide film 55 functions, for example, as an element isolation region in a peripheral region (not shown).

Then, the field oxide film 55 is removed. The field oxide film 55 is removed by using, for example, a wet etching method.

Figure 14:
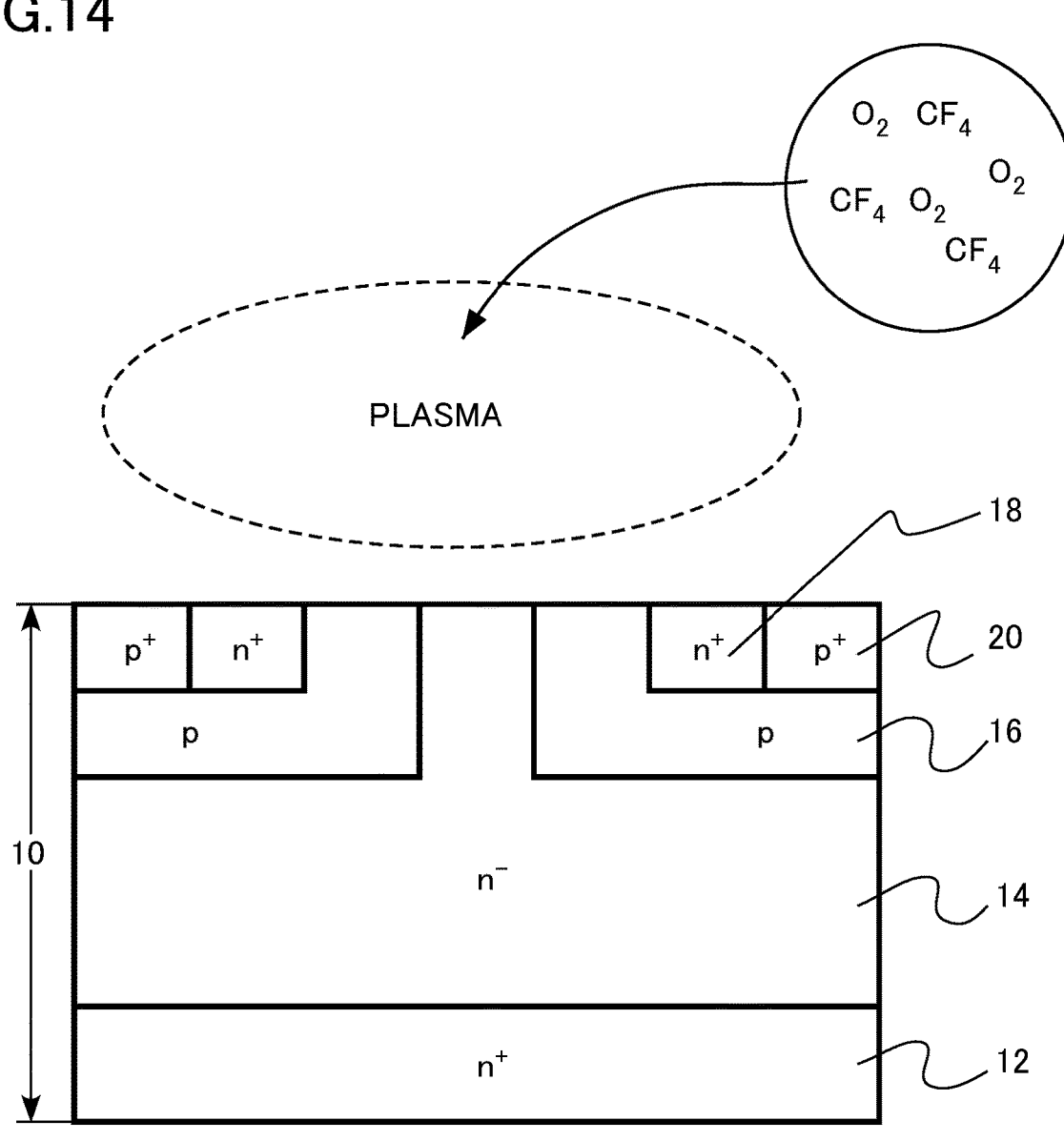
FIG. 14 is an explanatory diagram of the semiconductor device manufacturing method according to the first embodiment.

In step S109, chemical dry etching process for etching the surface of the silicon carbide layer 10 using a chemical dry etching method (CDE method) are performed (FIG. 14). The chemical dry etching process are an example of the first etching process.

The CDE method is a dry etching method using an etching apparatus in which a plasma generation unit and an etching processing unit are separated from each other. The CDE method has an advantage that a substrate to be etched is less damaged because the plasma generation unit and the etching processing unit are separated from each other. In addition, the CDE method has an advantage that isotropic etching process can be realized.

In the first etching process, the surface of the silicon carbide layer 10 is etched in an atmosphere containing plasma generated from gas containing halogen and oxygen. The first etching process is cleaning process. By etching the surface of the silicon carbide layer 10, for example, impurities on the surface of the silicon carbide layer 10 or a damaged layer on the surface are removed.

In the first etching process, the plasma-generating gas includes, for example, perfluorocarbon (PFC) and oxygen ($O_2$). Perfluorocarbon (PFC) is, for example, $CF_4$, $C_2F_6$, $C_3F_8$, or $C_5F_8$.

The atomic ratio of oxygen atoms to halogen atoms in the plasma-generating gas is, for example, equal to or more than 1.5 times. For example, when a gas containing $CF_4$ and oxygen ($O_2$) is used as a plasma-generating gas, the flow rate of oxygen ($O_2$) introduced into the etching apparatus is, for example, equal to or more than three times the flow rate of $CF_4$. By making the flow rate of oxygen ($O_2$) equal to or more than three times the flow rate of $CF_4$, the atomic ratio of oxygen atoms to halogen atoms in the gas becomes equal to or more than 1.5 times.

The plasma-generating gas may contain, for example, nitrogen (N).

The first etching process is performed at a temperature equal to or more than 20° C. and equal to or less than 1300° C., for example.

In the first etching process, the surface of the silicon carbide layer 10 is etched by 5 nm or more and 50 nm or less, for example.

Figure 15:
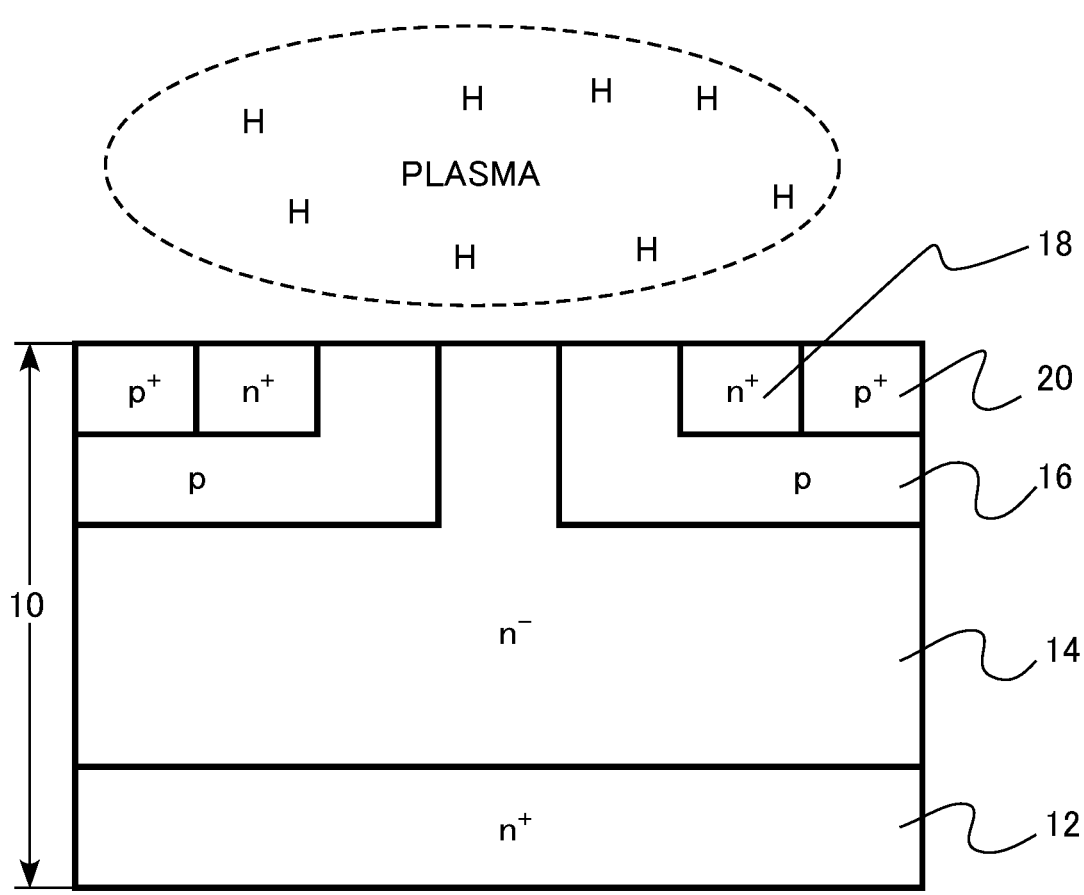
FIG. 15 is an explanatory diagram of the semiconductor device manufacturing method according to the first embodiment.

In step S110, hydrogen etching process is performed to etch the surface of the silicon carbide layer 10 in an atmosphere containing hydrogen plasma or atomic hydrogen (FIG. 15). The hydrogen etching process is an example of the second etching process.

In the second etching process, the surface of the silicon carbide layer 10 is etched in an atmosphere containing hydrogen plasma, which is activated hydrogen, or atomic hydrogen, which is activated hydrogen. In the second etching process, for example, a plasma etching apparatus using hydrogen plasma generated from hydrogen gas ($H_2$) is used. In the second etching process, for example, an etching apparatus that generates atomic hydrogen from hydrogen gas ($H_2$) using a heating catalyst method is used.

The second etching process is performed at a temperature equal to or more than 20° C. and equal to or less than 300° C., for example.

In the second etching process, the surface of the silicon carbide layer 10 is etched by 5 nm or more and 25 nm or less, for example.

Figure 16:
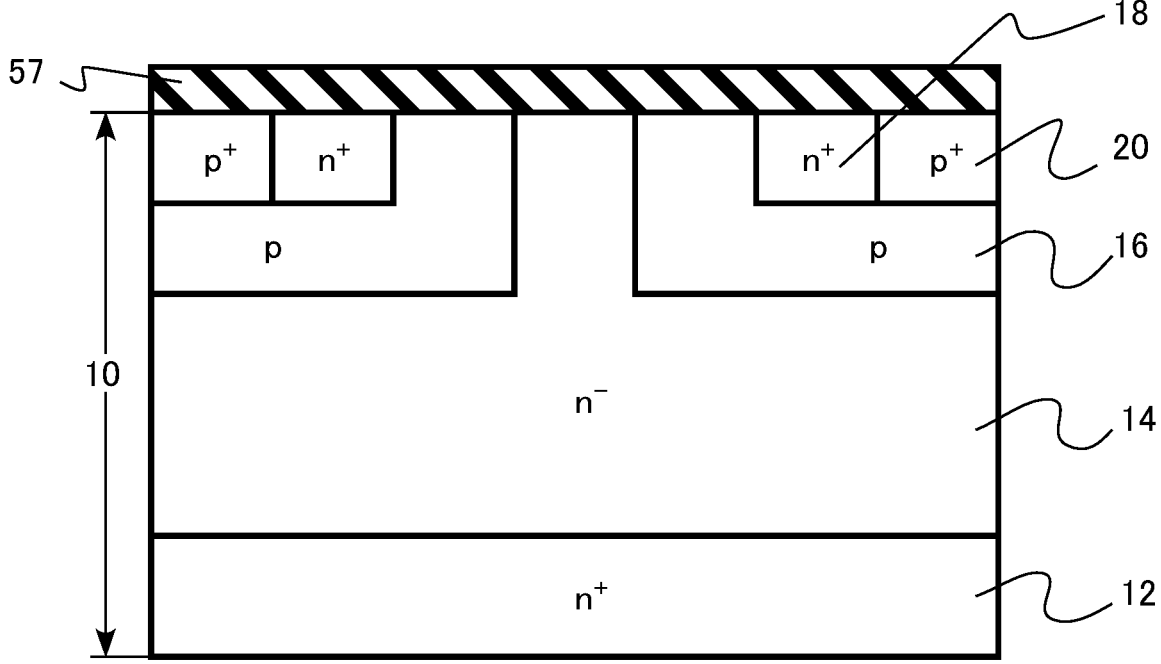
FIG. 16 is an explanatory diagram of the semiconductor device manufacturing method according to the first embodiment.

In step S111, the silicon oxide film 57 is formed on the silicon carbide layer 10 (FIG. 16). The silicon oxide film 57 finally becomes the gate insulating layer 28.

The silicon oxide film 57 is formed by using, for example, a vapor deposition method at low temperature and low oxygen partial pressure. For example, the silicon oxide film 57 is formed by using a CVD method or a PVD method at low temperature and low oxygen partial pressure. The silicon oxide film 57 is a deposited film. The thickness of the silicon oxide film 57 is, for example, equal to or more than 30 nm and equal to or less than 100 nm.

The silicon oxide film 57 is, for example, a silicon oxide film formed by a CVD method using tetraethyl orthosilicate (TEOS) as a source gas. In addition, the silicon oxide film 57 is, for example, a silicon oxide film formed by a CVD method using dichlorosilane gas ($SiH_2Cl_2$) and nitrous oxide gas ($N_2O$) as source gases.

In step S112, second heat treatment is performed. The second heat treatment is performed in an atmosphere containing ammonia gas ($NH_3$).

For example, the ammonia gas ($NH_3$) is supplied to a reaction furnace containing the silicon carbide layer 10 to perform heat treatment.

The temperature of the second heat treatment is, for example, equal to or more than 1200° C. and equal to or less than 1600° C.

The partial pressure of the ammonia gas in the atmosphere of the second heat treatment is, for example, equal to or more than 90%.

Figure 17:
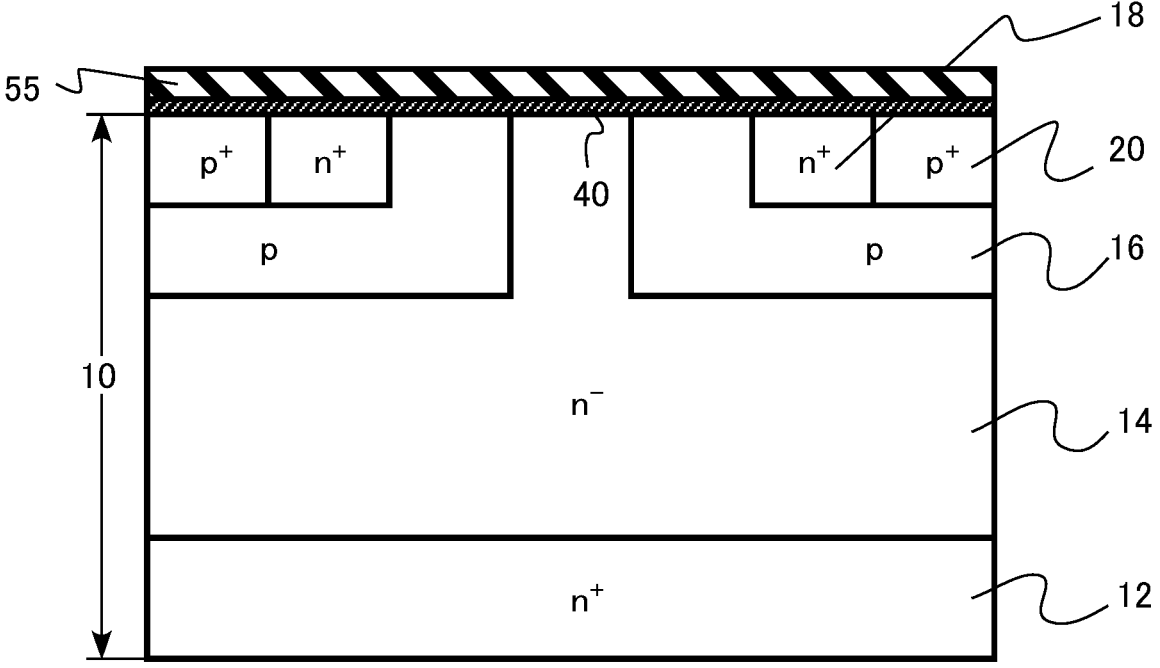
FIG. 17 is an explanatory diagram of the semiconductor device manufacturing method according to the first embodiment.

By the second heat treatment, the interface termination region 40 is formed at the interface between the silicon carbide layer 10 and the silicon oxide film (FIG. 17).

The second heat treatment also functions as densify annealing of the silicon oxide film. By the second heat treatment, the silicon oxide film becomes a high-density film.

In step S113, third heat treatment is performed. The third heat treatment is performed in an atmosphere containing nitrogen oxide gas (NOX). The nitrogen oxide gas is, for example, a nitric oxide gas (NO). In addition, the nitrogen oxide gas is, for example, a nitrous oxide gas ($N_2O$).

For example, the nitrogen oxide gas (NOx) is supplied to a reaction furnace containing the silicon carbide layer 10 to perform heat treatment.

The temperature of the third heat treatment is, for example, equal to or more than 750° C. and equal to or less than 1050° C. The temperature of the third heat treatment is, for example, lower than the temperature of the second heat treatment.

The partial pressure of the nitrogen oxide gas in the atmosphere of the third heat treatment is, for example, equal to or more than 10%.

By the third heat treatment, nitrogen in the silicon oxide film is removed. By the third heat treatment, a silicon oxide film with reduced nitrogen defects is formed.

In step S114, the gate electrode 30 is formed on the gate insulating layer 28. The gate electrode 30 is, for example, polycrystalline silicon containing n-type impurities or p-type impurities.

Figure 18:
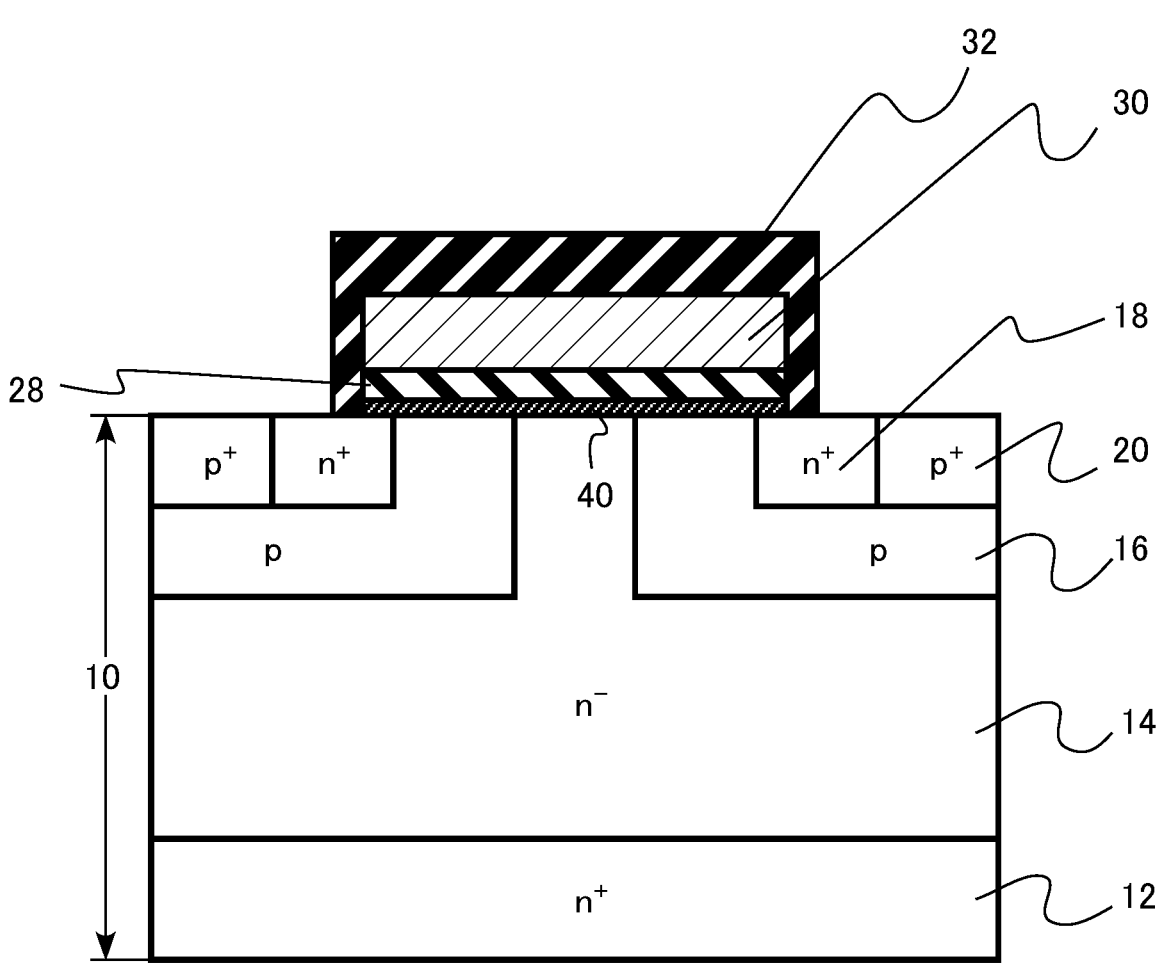
FIG. 18 is an explanatory diagram of the semiconductor device manufacturing method according to the first embodiment.

In step S115, the interlayer insulating film 32 is formed on the gate electrode 30 (FIG. 18). The interlayer insulating film 32 is, for example, a silicon oxide film.

In step S116, the source electrode 34 and the drain electrode 36 are formed. The source electrode 34 is formed on the source region 18 and the p-well contact region 20. The source electrode 34 is formed, for example, by sputtering nickel (Ni) and aluminum (Al).

The drain electrode 36 is formed on the back surface side of the silicon carbide layer 10. The drain electrode 36 is formed, for example, by sputtering nickel.

By the semiconductor device manufacturing method described above, the MOSFET 100 shown in FIG. 1 is formed.

Next, the function and effect of the semiconductor device manufacturing method according to the first embodiment will be described.

In the semiconductor device manufacturing method according to the first embodiment, the carbon vacancy density in the silicon carbide layer 10 is reduced by ion-implanting carbon in addition to ion-implanting aluminum, performing cleaning process using the CDE method, and then performing hydrogen etching process. Therefore, it is possible to reduce the carbon vacancy density in the silicon carbide layer 10 of the manufactured MOSFET 100. In particular, it is possible to reduce the carbon vacancy density in the channel region of the manufactured MOSFET 100. Therefore, it is possible to suppress a decrease in the mobility of carriers in the manufactured MOSFET 100. Details thereof will be described below.

When a MOSFET is formed using silicon carbide, there is a problem that the mobility of carriers decreases. One factor that decreases the mobility of carriers is considered to be the interface state between the silicon carbide layer and the gate insulating layer. It is considered that the interface state is caused by the dangling bonds present on the surface of the silicon carbide layer.

The MOSFET 100 according to the first embodiment includes the interface termination region 40 where nitrogen is segregated between the silicon carbide layer 10 and the gate insulating layer 28. In the interface termination region 40, the dangling bond is reduced by bonding the nitrogen atom to the silicon atom in a tri-coordinate bond. Therefore, a MOSFET in which a decrease in carrier mobility is suppressed is realized.

In addition, another cause of the problem of carrier mobility decrease when forming a MOSFET using silicon carbide is considered to be the presence of carbon vacancies in silicon carbide layer 10.

For example, the presence of carbon vacancies in the channel region of a MOSFET is believed to scatter carriers and decrease the Hall mobility of the carriers.

In the MOSFET 100 according to the first embodiment, the carbon vacancy density in the silicon carbide layer 10 is reduced due to using the semiconductor device manufacturing method according to the first embodiment. In particular, the carbon vacancy density in the channel region of the MOSFET 100 is reduced. For example, the carbon vacancy density in the channel region between the gate insulating layer 28 and a position approximately 100 nm away from the gate insulating layer 28 toward the silicon carbide layer 10 is reduced.

The MOSFET 100 according to the first embodiment has a sufficiently low carbon vacancy density in the channel region. Therefore, the Hall mobility of electrons in the channel region is, for example, equal to or more than 200 cm²/V·s.

The field effect mobility, which is an index of the on-current of a MOSFET, is determined according to the proportion of mobile charges in the Hall mobility. That is, the field effect mobility is smaller than the Hall mobility. At the silicon carbide MOS interface, the proportion of mobile charges is low due to poor interface termination efficiency and a large number of substrate defects and defects in the gate dielectric layer. Charges other than the mobile charges are trapped charges.

For example, it is possible to increase the proportion of mobile charges by optimizing an interface termination method or a termination element. However, if the Hall mobility is low, it is difficult to greatly improve the field effect mobility. In order to greatly improve the field effect mobility, it is desirable to improve the Hall mobility so as to be equal to or more than 150 cm²/V·s.

In the semiconductor device manufacturing method according to the first embodiment, the Hall mobility of the MOSFET 100 can be greatly improved by reducing the carbon vacancy density. The Hall mobility is, for example, equal to or more than 200 cm²/V·s. By further reducing the carbon vacancy density, for example, a Hall mobility equal to or more than 350 cm²/V·s, and further equal to or more than 450 cm²/V·s is realized.

The following three processes are conceivable as manufacturing processes in which carbon vacancies which reduce the mobility of carriers are generated in the silicon carbide layer when manufacturing a MOSFET.

The first process is ion implantation of impurities into the silicon carbide layer. Carbon vacancies and interstitial carbon are formed in the silicon carbide layer 10 by the energy of the ion-implanted impurities. For example, in the p-well region, carbon vacancies and interstitial carbon are formed with a volume density similar to that of the implanted ions.

The second process is activation annealing for activating impurities introduced into the silicon carbide layer by ion implantation. During activation annealing, in order to reduce the free energy of the system of the silicon carbide layer, carbon vacancies and interstitial carbon are generated in the silicon carbide layer to increase the entropy. The amount of carbon vacancies and interstitial carbon generated increases as the activation annealing temperature increases. Since the formation of the silicon carbide layer by epitaxial growth is also a high-temperature process, carbon vacancies on the order of $10^{13}$ cm$^{-3}$ remain in the silicon carbide layer. In addition, high-temperature activation annealing can generate carbon vacancies on the order of $1\times10^{14}$ cm$^{-3}$.

The third process is a process of oxidizing the surface of the silicon carbide layer. For example, the third process is a thermal oxidation treatment for forming a thermal oxide film. During oxidation, carbon vacancies and interstitial carbon are formed in the silicon carbide layer due to strain on the surface of the silicon carbide layer. Oxidation greatly strains the surface to generate carbon vacancies on the order of $1\times10^{18}$ cm$^{-3}$.

In the method for manufacturing the MOSFET 100 according to the first embodiment, aluminum ion implantation for forming the p-well region 16 in the silicon carbide layer 10 is performed, and then carbon ion implantation is performed in the same region of the silicon carbide layer 10. The second dose amount of carbon is equal to or more than ten times the first dose amount of aluminum.

According to the method for manufacturing the MOSFET 100 according to the first embodiment, a large amount of excess interstitial carbon is present in the p-well region 16 due to carbon ion implantation. Due to heat treatment performed after the carbon ion implantation, carbon vacancies generated by the aluminum ion implantation are filled with the excess interstitial carbon. Therefore, the carbon vacancy density in the p-well region 16 is reduced.

From the viewpoint of appropriately maintaining the concentration of p-type impurities in the p-well region 16, it is preferable that the first dose amount of aluminum is equal to or less than $1\times10^{14}$ cm$^{-2}$. From the viewpoint of reducing the carbon vacancy density in the p-well region 16, the second dose amount of carbon is preferably equal to or more than $1\times10^{15}$ cm$^{-2}$, more preferably equal to or more than $1\times10^{16}$ cm$^{-2}$.

From the viewpoint of reducing the carbon vacancy density in the p-well region 16, it is preferable that the second dose amount of carbon is equal to or more than 100 times the first dose amount of aluminum.

From the viewpoint of reducing the carbon vacancy density in the p-well region 16, the second projected range Rp2 for carbon ion implantation is preferably equal to or more than 80% and equal to or less than 120% of the first projected range Rp1 for aluminum ion implantation, more preferably equal to or more than 90% and equal to or less than 110% of the first projected range Rp1 for aluminum ion implantation.

By bringing the first projected range Rp1 and the second projected range Rp2 closer to each other, it becomes easy for the carbon concentration distribution after ion implantation to completely cover the aluminum concentration distribution after ion implantation. The carbon vacancy density in the p-well region 16 is reduced by completely covering the aluminum concentration distribution after ion implantation with the carbon concentration distribution after ion implantation.

From the viewpoint of appropriately maintaining the depth of the p-well region 16, it is preferable that the first projected range Rp1 and the second projected range Rp2 are equal to or less than 0.6 μm.

In the method for manufacturing the MOSFET 100 according to the first embodiment, a large amount of excess interstitial carbon is present in the silicon carbide layer 10 during the first heat treatment for activating the aluminum introduced into the silicon carbide layer 10 by ion implantation. Due to the presence of a large amount of interstitial carbon, an entropy increase necessary for reducing the free energy of the system of the silicon carbide layer 10 is realized. Therefore, an increase in carbon vacancies in the silicon carbide layer 10 due to the first heat treatment is suppressed.

In the method for manufacturing the MOSFET 100 according to the first embodiment, since a large amount of excess interstitial carbon is present in the silicon carbide layer 10 during the first heat treatment, the entry of aluminum atoms into the carbon sites of silicon carbide is suppressed. Therefore, the entry of aluminum atoms into the silicon sites of silicon carbide is promoted. As a result, the activation rate of aluminum is improved.

In addition, in the method for manufacturing the MOSFET 100 according to the first embodiment, since a large amount of excess interstitial carbon is present in the silicon carbide layer 10 during the first heat treatment, an increase in the carbon vacancy density in the silicon carbide layer 10 is suppressed even if the first heat treatment is performed at a high temperature. Therefore, it is possible to perform the first heat treatment at a high temperature. As a result, it is possible to improve the activation rate of aluminum.

From the viewpoint of improving the activity rate of aluminum, the temperature of the first heat treatment is preferably equal to or more than 1850° C., more preferably equal to or more than 1900° C., and even more preferably equal to or more than 1950° C. From the viewpoint of performing efficient process, it is preferable that the temperature of the first heat treatment is equal to or less than 2000° C. From the viewpoint of the activity rate, even if the temperature exceeds 2000° C., a large increase in the activity rate cannot be expected.

It is preferable that the first heat treatment includes a first step whose temperature is equal to or more than 1600° C. and a second step whose temperature is lower than the temperature of the first step. It is preferable that the second step is equal to or less than 1000° C. It is preferable that the heat treatment time of the second step is longer than the heat treatment time of the first step.

In the first step, aluminum and phosphorus ion-implanted into the silicon carbide layer 10 are activated, so that the interstitial carbon fills the carbon vacancies. Even when the carbon vacancies are filled, there is still excess interstitial carbon. Then, in the second step of low temperature, excess interstitial carbon is expelled from the silicon carbide layer 10 and absorbed by the carbon film 54.

Figure 19:
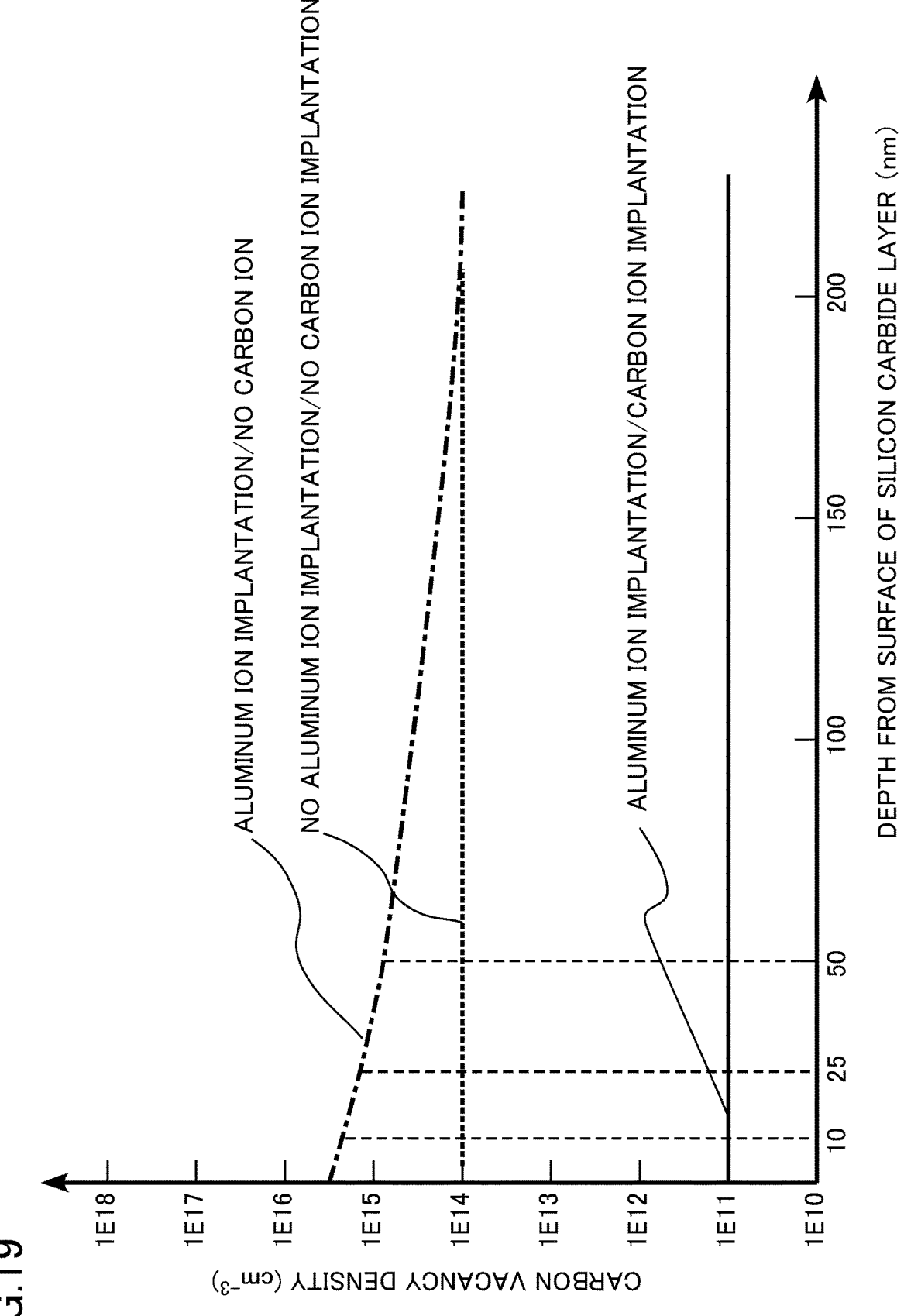
FIG. 19 is an explanatory diagram of the function and effect of the semiconductor device manufacturing method according to the first embodiment.

FIG. 19 is an explanatory diagram of the function and effect of the semiconductor device manufacturing method according to the first embodiment. FIG. 19 is a diagram showing the relationship between the depth from the silicon carbide layer surface and the carbon vacancy density. In FIG. 19, a case where heat treatment equivalent to activation annealing is applied regardless of the presence or absence of ion implantation is assumed.

As shown in FIG. 19, the carbon vacancy density of the silicon carbide layer becomes approximately 1E14 cm$^{-3}$ by applying heat treatment equivalent to activation annealing. In addition, when aluminum ion implantation is performed, carbon vacancies are formed in the silicon carbide layer 10 by the energy of the ion-implanted aluminum, and the carbon vacancy density is equal to or more than 1E15 cm$^{-3}$ on the surface.

On the other hand, as shown in FIG. 19, when carbon ion implantation is performed in addition to aluminum ion implantation, the carbon vacancy density can be suppressed to a low level equal to or less than of 1E11 cm$^{-3}$.

FIG. 20 is a process flow diagram of a semiconductor device manufacturing method according to a comparative example.

As shown in FIG. 20, the semiconductor device manufacturing method according to the comparative example includes silicon carbide layer preparation (step S100), aluminum ion implantation (step S101), carbon ion implantation (step S102), phosphorus ion implantation (step S103), aluminum ion implantation (step S104), carbon film formation (step S105), first heat treatment (step S106), carbon film removal (step S107), field oxide film formation (step S108), sacrificial oxidation (step S999), silicon oxide film formation (step S111), second heat treatment (step S112), third heat treatment (step S113), gate electrode formation (step S114), interlayer insulating film formation (step S115), and source electrode/drain electrode formation (step S116). The semiconductor device manufacturing method according to the comparative example is different from the semiconductor device manufacturing method according to the first embodiment in that the sacrificial oxidation (step S999) is included instead of the chemical dry etching process (step S109) and the hydrogen plasma etching process (step S110).

In the semiconductor device manufacturing method according to the comparative example, similarly to the semiconductor device manufacturing method according to the first embodiment, a field oxide film is formed on the silicon carbide layer in step S108. Thereafter, the field oxide film is removed, and then a sacrificial oxide film is formed on the silicon carbide layer in step S109.

The sacrificial oxide film is a silicon oxide film formed by thermally oxidizing the surface of the silicon carbide layer. Thereafter, the sacrificial oxide film is removed. The sacrificial oxide film is removed by using, for example, a wet etching method.

When forming the sacrificial oxide film, the surface of the silicon carbide layer is oxidized. By forming the sacrificial oxide film, for example, impurities or damage on the surface of the silicon carbide layer is removed. The formation of the sacrificial oxide film is cleaning process.

Thereafter, in step S111, a silicon oxide film is formed on the silicon carbide layer in the same manner as in the semiconductor device manufacturing method according to the first embodiment. The silicon oxide film finally becomes the gate insulating layer.

Figure 21:
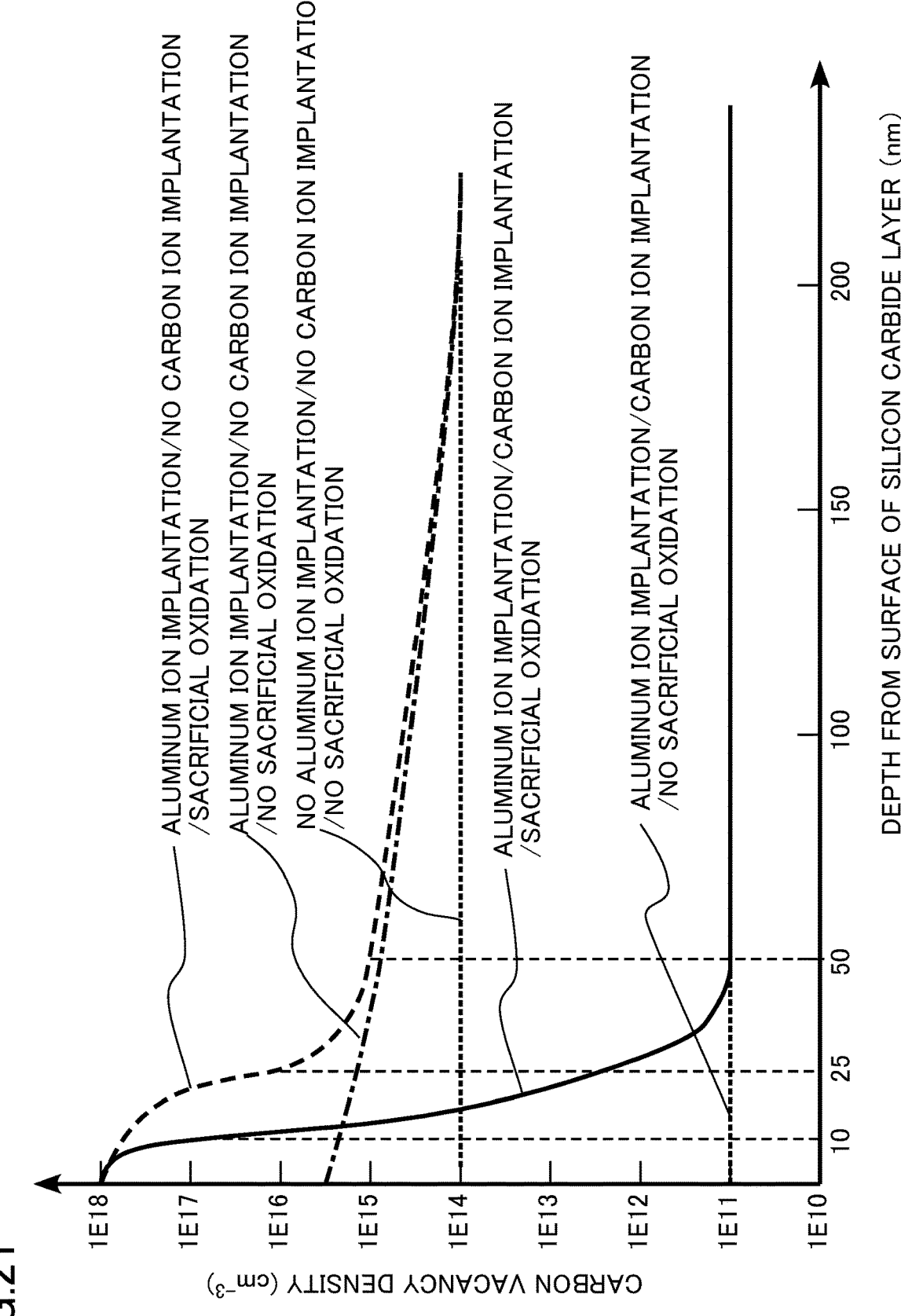
FIG. 21 is an explanatory diagram of the function and effect of the semiconductor device manufacturing method according to the first embodiment.

FIG. 21 is an explanatory diagram of the function and effect of the semiconductor device manufacturing method according to the first embodiment. FIG. 21 is a diagram showing the relationship between the depth from the silicon carbide layer surface and the carbon vacancy density.

FIG. 21 is an explanatory diagram of changes in carbon vacancy density due to formation of a sacrificial oxide film using the semiconductor device manufacturing method according to the comparative example. In FIG. 21, a case where heat treatment equivalent to activation annealing is applied regardless of the presence or absence of ion implantation is assumed.

FIG. 21 shows the influence of the formation of the sacrificial oxide film on the carbon vacancy density with the presence or absence of aluminum ion implantation and the presence or absence of carbon ion implantation as parameters.

As shown in FIG. 21, regardless of the presence or absence of aluminum ion implantation and the presence or absence of carbon ion implantation, carbon vacancies on the order of $1 \times 10^{18}$ cm$^{-3}$ are formed on the surface of the silicon carbide layer by forming the sacrificial oxide film.

Even when the carbon vacancy density is suppressed to a low level equal to or less than of 1E11 cm$^{-3}$ by performing carbon ion implantation in addition to aluminum ion implantation, the carbon vacancy density on the surface of the silicon carbide layer increases to the order of $1 \times 10^{18}$ cm$^{-3}$ by forming the sacrificial oxide film. By forming the sacrificial oxide film, the carbon vacancy density increases up to a region of approximately 50 µm from the surface of the silicon carbide layer.

It is considered that the reason why many carbon vacancies are formed on the surface of the silicon carbide layer is that the surface of the silicon carbide layer is strained when the sacrificial oxide film is formed by thermal oxidation.

In the semiconductor device manufacturing method according to the first embodiment, cleaning process using the CDE method and subsequent hydrogen etching process is performed instead of forming the sacrificial oxide film by thermal oxidation.

Figure 22:
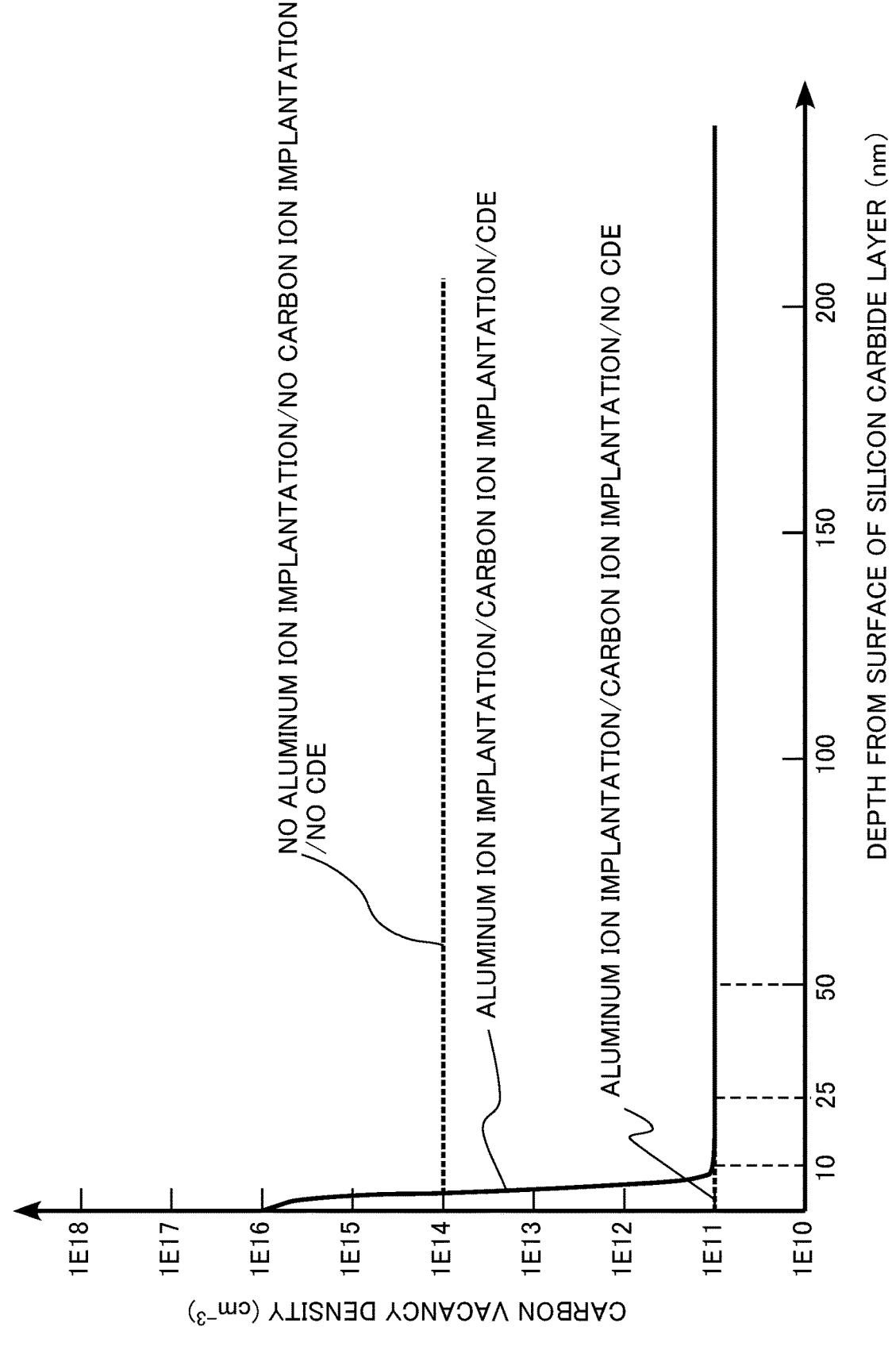
FIG. 22 is an explanatory diagram of the function and effect of the semiconductor device manufacturing method according to the first embodiment.

FIG. 22 is an explanatory diagram of the function and effect of the semiconductor device manufacturing method according to the first embodiment. FIG. 22 is a diagram showing the relationship between the depth from the silicon carbide layer surface and the carbon vacancy density.

FIG. 22 is an explanatory diagram of changes in carbon vacancy density due to cleaning process using the CDE method in the semiconductor device manufacturing method according to the first embodiment. In FIG. 22, a case where heat treatment equivalent to activation annealing is applied regardless of the presence or absence of ion implantation is assumed.

As shown in FIG. 22, carbon vacancies on the order of $1 \times 10^{16}$ cm$^{-3}$ are formed on the surface of the silicon carbide layer by cleaning process using the CDE method.

When the carbon vacancy density is suppressed to a low level equal to or less than of 1E11 cm$^{-3}$ by performing carbon ion implantation in addition to aluminum ion implantation, the carbon vacancy density increases up to a region of approximately 10 µm from the surface of the silicon carbide layer.

It is considered that the reason why carbon vacancies are formed by the cleaning process using the CDE method is that the surface of the silicon carbide layer is oxidized because the plasma generated from the oxygen-containing gas is used for etching. However, the amount of oxidation of the surface of the silicon carbide layer is smaller than that in a case where the sacrificial oxide film is formed by thermal oxidation. Therefore, it is considered that the increase in the carbon vacancy density is significantly suppressed as compared with the case where the sacrificial oxide film is formed by thermal oxidation.

In addition, in the semiconductor device manufacturing method according to the first embodiment, the hydrogen etching process is performed after the cleaning process using the CDE method. The surface of the silicon carbide layer is etched by the hydrogen etching process.

By etching the surface of the silicon carbide layer, the carbon vacancy density in the silicon carbide layer can be reduced. For example, referring to the carbon vacancy density distribution after the cleaning process using the CDE method shown in FIG. 22, the carbon vacancy density on the surface of the silicon carbide layer can be returned to the level equal to or less than 1E11 cm$^{-3}$ before the cleaning process by etching the surface of the silicon carbide layer by 10 nm.

A Hall mobility of about 130 cm$^2$/V·s can be expected at a carbon vacancy density of 1E17 cm$^{-3}$, a Hall mobility of approximately 160 cm$^2$/V·s can be expected at a carbon vacancy density of 1E16 cm$^{-3}$, a Hall mobility of approximately 180 cm$^2$/V·s can be expected at a carbon vacancy density of 1E15 cm$^{-3}$, a Hall mobility of approximately 200 cm$^2$/V·s can be expected at a carbon vacancy density of 1E14 cm$^{-3}$, a Hall mobility of approximately 250 cm$^2$/V·s can be expected at a carbon vacancy density of 1E13 cm$^{-3}$, a Hall mobility of approximately 300 cm$^2$/V·s can be expected at a carbon vacancy density of 1E12 cm$^{-3}$, a Hall mobility of approximately 350 cm$^2$/V·s can be expected at a carbon vacancy density of 1E11 cm$^{-3}$, a Hall mobility of approximately 400 cm$^2$/V·s can be expected at a carbon vacancy density of 5E10 cm$^{-3}$, and a Hall mobility of approximately 450 cm$^2$/V·s can be expected at a carbon vacancy density of 1E10 cm$^{-3}$.

According to the semiconductor device manufacturing method according to the first embodiment, an increase in the carbon vacancy density in the silicon carbide layer can be suppressed by performing the cleaning process using the CDE method and the subsequent hydrogen etching process. By suppressing the increase in the carbon vacancy density, it is possible to suppress a decrease in the Hall mobility in the channel region of the MOSFET. Therefore, according to the semiconductor device manufacturing method according to the first embodiment, a MOSFET in which a decrease in the mobility of carriers is suppressed can be manufactured.

The cleaning process using the CDE method cause less damage to the surface of the silicon carbide layer to be etched. Therefore, for example, roughening of the surface of the silicon carbide layer due to etching damage is also suppressed. As a result, degradation of the characteristics of the MOSFET due to surface roughness of the silicon carbide layer is suppressed.

In addition, the surface of the silicon carbide layer is smoothed by the hydrogen etching process. By smoothing the surface of the silicon carbide layer, for example, the scattering of carriers is suppressed to improve the mobility. As a result, the characteristics of the MOSFET are improved.

In the cleaning process using the CDE method, it is preferable that the atomic ratio of oxygen atoms to halogen atoms in the plasma-generating gas is equal to or more than 1.5 times. When the atomic ratio of oxygen atoms to halogen atoms in the gas is equal to or more than 1.5 times, the flatness of the surface of the silicon carbide layer after etching is improved. For example, when a gas containing $CF_4$ and oxygen ($O_2$) is used as a plasma-generating gas, it is preferable that the flow rate of oxygen ($O_2$) introduced into the etching apparatus is equal to or more than three times the flow rate of $CF_4$.

The temperature of the cleaning process using the CDE method is preferably equal to or more than 20° C., more preferably equal to or more than 50° C., and even more preferably equal to or more than 100° C. By setting the temperature of the cleaning process to be equal to or more than the lower limit value described above, the etching rate of the silicon carbide layer is stabilized.

The temperature of the cleaning process using the CDE method is preferably equal to or less than 1300° C., more preferably equal to or less than 950° C., even more preferably equal to or less than 850° C., and most preferably equal to or less than 750° C. By setting the temperature of the cleaning process to be equal to or less than the upper limit value described above, the flatness of the surface of the silicon carbide layer after etching is improved.

The amount of etching of the silicon carbide layer by the cleaning process using the CDE method is preferably equal to or more than 5 nm and equal to or less than 50 nm, more preferably equal to or more than 10 nm and equal to or less than 25 nm. By setting the amount of etching of the silicon carbide layer to be equal to or more than the lower limit value described above, impurities or damage on the surface of the silicon carbide layer is effectively removed. In addition, by setting the amount of etching of the silicon carbide layer to be equal to or less than the upper limit value described above, the flatness of the surface of the silicon carbide layer after etching is improved.

The hydrogen etching process is performed in an atmosphere containing hydrogen plasma or atomic hydrogen. Since the hydrogen etching process is performed in an atmosphere containing active hydrogen, the hydrogen etching process can be performed at a relatively low temperature.

The temperature of the hydrogen etching process is preferably equal to or less than 300° C., more preferably equal to or less than 200° C., and even more preferably equal to or less than 100° C. By setting the temperature of the hydrogen etching process to be equal to or less than the upper limit value described above, the flatness of the surface of the silicon carbide layer after etching is improved. In addition, it is possible to selectively etch a region having a high carbon vacancy density in the silicon carbide layer. In the hydrogen etching process, etching proceeds as hydrogen enters carbon vacancies in the silicon carbide layer. Therefore, in order to sufficiently diffuse hydrogen, it is preferable to perform the hydrogen etching process at a temperature equal to or more than room temperature (20° C.).

The amount of etching of the silicon carbide layer by the hydrogen etching process is preferably equal to or more than 5 nm and equal to or less than 25 nm, more preferably equal to or more than 10 nm and equal to or less than 20 nm. By setting the amount of etching of the silicon carbide layer to be equal to or more than the lower limit value described above, the carbon vacancy density in the silicon carbide layer can be effectively reduced. By setting the amount of etching of the silicon carbide layer to be equal to or less than the upper limit value described above, the flatness of the surface of the silicon carbide layer after etching is improved. The amount of etching of the silicon carbide layer is sufficient if this is equal to or less than the upper limit value described above. Further etching does not significantly reduce the amount of carbon vacancies. Since further etching hardly progresses, additional measures such as increasing the temperature to over 300° C. are required to proceed with the etching. For example, increasing the temperature may degrade the flatness of the surface of the silicon carbide layer after etching.

In the method for manufacturing the MOSFET 100 according to the first embodiment, the gate insulating layer 28 is formed by using a vapor deposition method at low temperature and low oxygen partial pressure.

Therefore, the oxidation of the surface of the silicon carbide layer 10 is suppressed as compared with thermal oxidation. As a result, an increase in carbon vacancies in the silicon carbide layer 10 when forming the gate insulating layer 28 is suppressed.

In addition, in the method for manufacturing the MOSFET 100 according to the first embodiment, the interface termination region 40 is formed by the second heat treatment in an atmosphere containing ammonia gas ($NH_3$). By forming the interface termination region 40 in an atmosphere containing ammonia gas without interfacial oxidation, an increase in carbon vacancies in the silicon carbide layer 10 is suppressed.

In the method for manufacturing the MOSFET 100 according to the first embodiment, the third heat treatment is performed in an atmosphere containing nitrogen oxide gas (NOx) after the second heat treatment for forming the interface termination region 40.

By the third heat treatment, nitrogen in the gate insulating layer 28 is removed. By the third heat treatment, the gate insulating layer 28 with reduced nitrogen defects is formed.

(Modification Examples)

A semiconductor device manufacturing method according to a modification example of the first embodiment is different from the semiconductor device manufacturing method according to the first embodiment in that the second ion implantation for implanting carbon ions is not performed.

In the semiconductor device manufacturing method according to the modification example of the first embodiment, carbon ion implantation (step S102) is not performed in the process flow of the semiconductor device manufacturing method according to the first embodiment shown in FIG. 3, for example.

Figure 23:
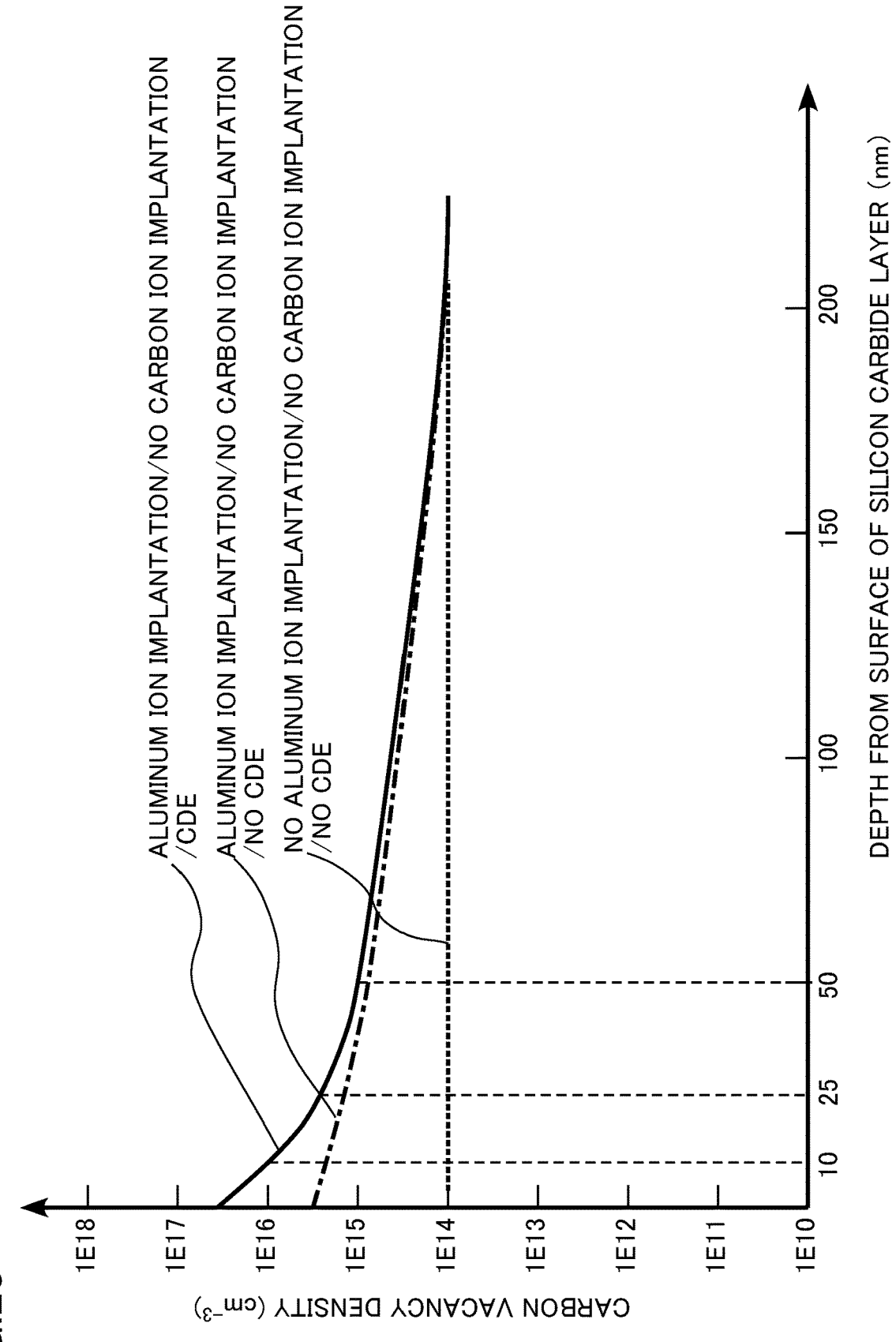
FIG. 23 is an explanatory diagram of the function and effect of a semiconductor device manufacturing method according to a modification example of the first embodiment.

FIG. 23 is an explanatory diagram of the function and effect of the semiconductor device manufacturing method according to the modification example of the first embodiment. FIG. 23 is a diagram showing the relationship between the depth from the silicon carbide layer surface and the carbon vacancy density.

FIG. 23 is an explanatory diagram of changes in carbon vacancy density due to cleaning process using the CDE method in the semiconductor device manufacturing method according to the modification example of the first embodiment. In FIG. 23, a case where heat treatment equivalent to activation annealing is applied regardless of the presence or absence of ion implantation is assumed.

When only aluminum ion implantation is performed without carbon ion implantation, the carbon vacancy density on the surface of the silicon carbide layer is equal to or more than 1E15 $cm^{-3}$ before the cleaning process using the CDE method is performed. In addition, by performing the cleaning process using the CDE method, carbon vacancies equal to or more than $1 \times 10^{16}$ $cm^{-3}$ are formed on the surface of the silicon carbide layer.

For example, by performing etching by approximately 25 nm from the surface of the silicon carbide layer by the hydrogen etching process, the carbon vacancy density on the surface of the silicon carbide layer can be returned to the state before the cleaning process using the CDE method.

In addition, although the cleaning process using the CDE method have been described as cleaning process that replaces sacrificial oxidation, it is also possible to combine the sacrificial oxidation and the cleaning process using the CDE method, for example. In this case, for example, by reducing the amount of sacrificial oxidation, an increase in the carbon vacancy density on the surface of the silicon carbide layer can be suppressed.

As described above, according to the first embodiment and its modification example, a semiconductor device manufacturing method is realized in which the carbon vacancy density in the channel region is reduced by performing the cleaning process using the CDE method and the hydrogen etching process and accordingly a decrease in carrier mobility can be suppressed.

Second Embodiment

A semiconductor device manufacturing method according to a second embodiment includes: forming a p-type silicon carbide film on an n-type silicon carbide layer using an epitaxial growth method; performing a first etching process etching a surface of the silicon carbide film in an atmosphere containing plasma generated from a gas containing halogen and oxygen; performing a second etching process etching the surface in an atmosphere containing hydrogen plasma or atomic hydrogen; forming a silicon oxide film on the surface; and forming a gate electrode on the silicon oxide film. The semiconductor device manufacturing method according to the second embodiment is different from the semiconductor device manufacturing method according to the first embodiment in that a p-type silicon carbide film is formed by using an epitaxial growth method. Hereinafter, the description of a part of the content overlapping the first embodiment may be omitted.

A semiconductor device manufactured by the semiconductor device manufacturing method according to the second embodiment has the same structure as the semiconductor device manufactured by the semiconductor device manufacturing method according to the first embodiment shown in FIG. 1. However, the p-well is formed by using an epitaxial growth method rather than ion implantation.

Figure 25:
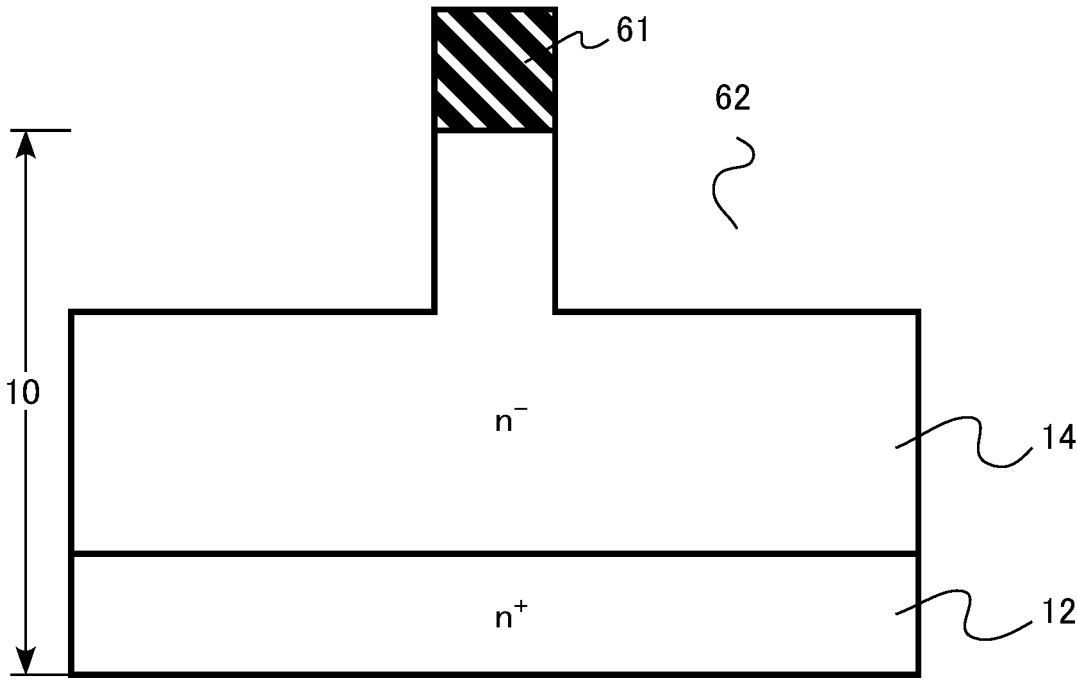
FIG. 25 is an explanatory diagram of the semiconductor device manufacturing method according to the second embodiment.
Figure 26:
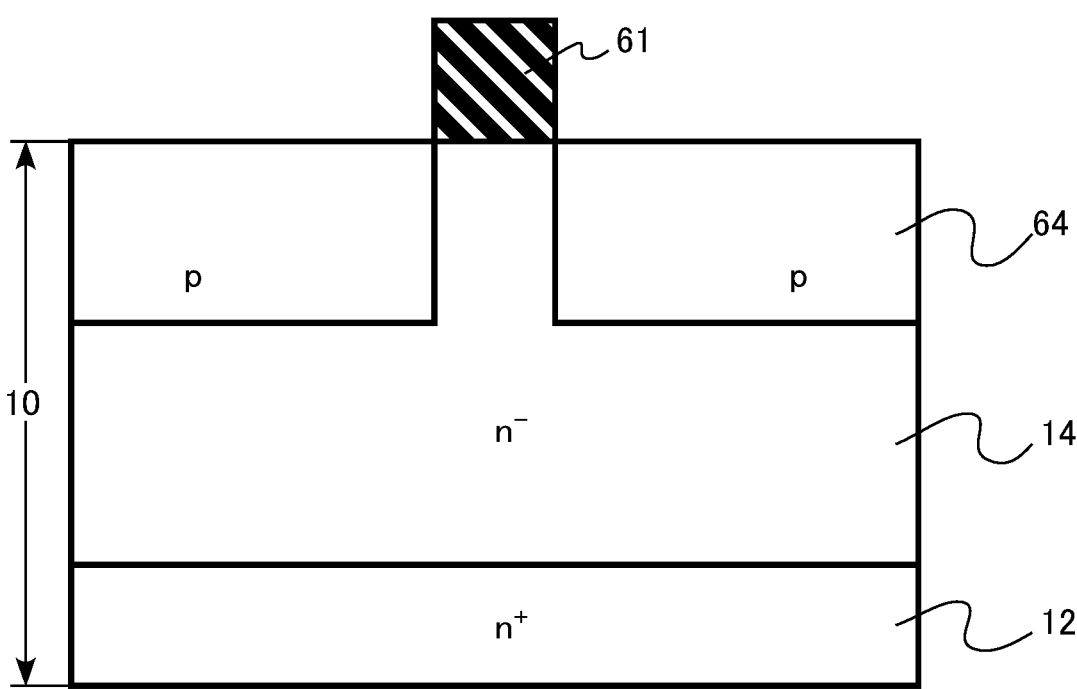
FIG. 26 is an explanatory diagram of the semiconductor device manufacturing method according to the second embodiment.

FIG. 24 is a process flow diagram of the semiconductor device manufacturing method according to the second embodiment. FIGS. 25 and 26 are explanatory diagrams of the semiconductor device manufacturing method according to the second embodiment. FIGS. 25 and 26 are cross-sectional views during manufacturing.

As shown in FIG. 24, the semiconductor device manufacturing method according to the second embodiment includes silicon carbide layer preparation (step S100), p-well trench formation (step S201), epitaxial film formation (step S202), phosphorus ion implantation (step S103), aluminum ion implantation (step S104), carbon film formation (step S105), first heat treatment (step S106), carbon film removal (step S107), field oxide film formation (step S108), chemical dry etching process (step S109), hydrogen plasma etching process (step S110), silicon oxide film formation (step S111), second heat treatment (step S112), third heat treatment (step S113), gate electrode formation (step S114), interlayer insulating film formation (step S115), and source electrode/drain electrode formation (step S116).

The semiconductor device manufacturing method according to the second embodiment is different from the semiconductor device manufacturing method according to the first embodiment shown in FIG. 3 in that the p-well trench formation (step S201) and the epitaxial film formation (step S202) are included instead of the aluminum ion implantation (step S101) and the carbon ion implantation (step S102).

In step S100, the n-type silicon carbide layer 10 is prepared.

In step S201, a mask material 61 is formed on the surface of the n-type silicon carbide layer 10, for example, by forming an insulating film and patterning the insulating film by photolithography and etching.

Then, the n-type silicon carbide layer 10 is etched by using the mask material 61 as a mask to form a p-well trench 62 (FIG. 25). The p-well trench 62 is an example of a trench. The p-well trench 62 is formed by using, for example, a reactive ion etching method (RIE method).

Then, in step S202, a p-type silicon carbide film is formed on the n-type silicon carbide layer 10 by using an epitaxial growth method (FIG. 26).

Then, the mask material 61 is removed by wet etching, for example.

Thereafter, steps S103 to S116 are performed by using the same method as in the semiconductor device manufacturing method according to the first embodiment.

Figure 27:
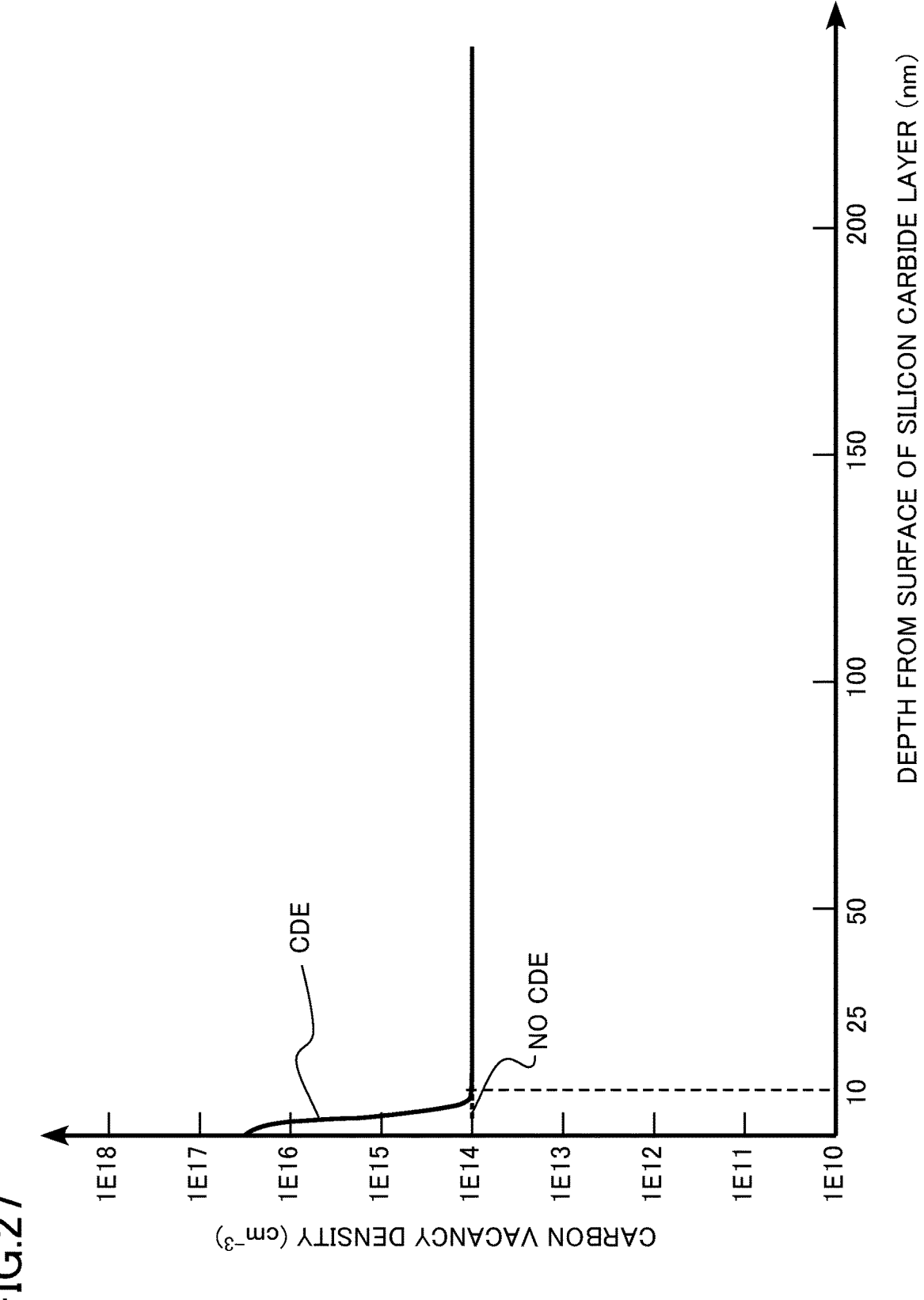
FIG. 27 is an explanatory diagram of the function and effect of the semiconductor device manufacturing method according to the second embodiment.

FIG. 27 is an explanatory diagram of the function and effect of the semiconductor device manufacturing method according to the second embodiment. FIG. 27 is an explanatory diagram of changes in carbon vacancy density due to cleaning process using the CDE method in the semiconductor device manufacturing method according to the second embodiment. In FIG. 27, a case where heat treatment equivalent to activation annealing for ion implantation is applied is assumed.

As shown in FIG. 27, the carbon vacancy density in the silicon carbide layer is approximately 1E14 $cm^{-3}$ before the cleaning process using the CDE method.

Then, as shown in FIG. 27, carbon vacancies on the order of $1 \times 10^{16}$ $cm^{-3}$ are formed on the surface of the silicon carbide layer by the cleaning process using the CDE method.

In the semiconductor device manufacturing method according to the second embodiment, the hydrogen etching process is performed after the cleaning process using the CDE method. The surface of the silicon carbide layer is etched by the hydrogen etching process.

By etching the surface of the silicon carbide layer, the carbon vacancy density in the silicon carbide layer can be reduced. For example, referring to the carbon vacancy density distribution after the cleaning process using the CDE method shown in FIG. 27, the carbon vacancy density can be returned to the level equal to or less than 1E14 cm$^{-3}$ before the cleaning process by etching the surface of the silicon carbide layer by 10 nm.

As described above, according to the second embodiment, a semiconductor device manufacturing method is realized in which the carbon vacancy density in the channel region is reduced by performing the cleaning process using the CDE method and the hydrogen etching process and accordingly a decrease in carrier mobility can be suppressed.

Third Embodiment

A semiconductor device manufacturing method according to a third embodiment is different from the semiconductor device manufacturing method according to the first embodiment in that a trench is formed in the silicon carbide layer before the first etching process after the first heat treatment and the surface of the silicon carbide layer on which the first etching process and the second etching process are performed is the sidewall surface of the trench. Hereinafter, the description of a part of the content overlapping the first embodiment may be omitted.

Figure 28:
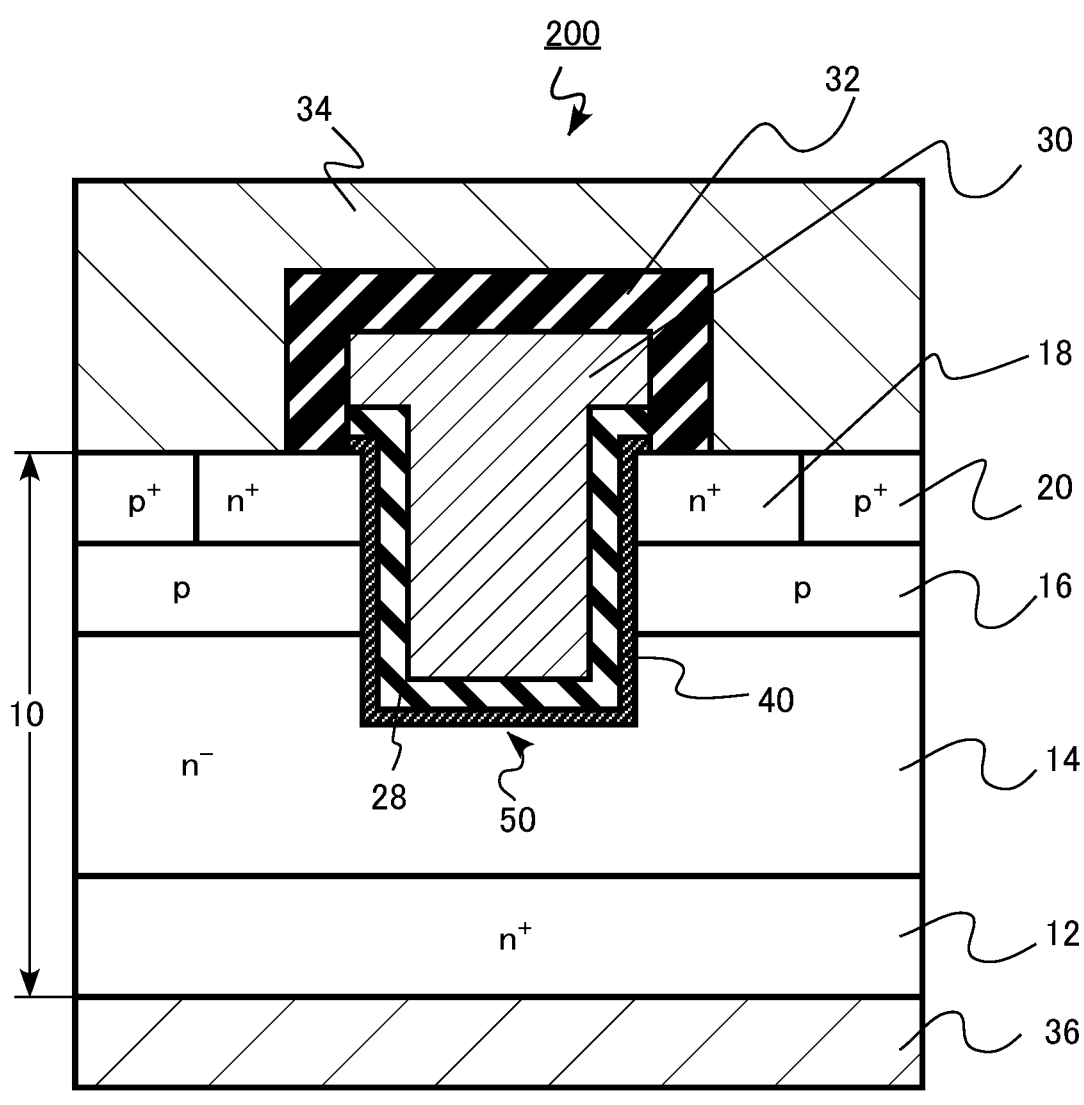
FIG. 28 is a schematic cross-sectional view of a semiconductor device manufactured by a semiconductor device manufacturing method according to a third embodiment.

FIG. 28 is a schematic cross-sectional view of a semiconductor device manufactured by the semiconductor device manufacturing method according to the third embodiment. The semiconductor device according to the third embodiment is a MOSFET 200. The MOSFET 200 is a trench gate type MOSFET having a gate electrode in a trench. In addition, the MOSFET 200 is an n-channel MOSFET having electrons as carriers.

The MOSFET 200 includes a silicon carbide layer 10, a gate insulating layer 28, a gate electrode 30, an interlayer insulating film 32, a source electrode 34, a drain electrode 36, an interface termination region 40, and a trench 50.

The silicon carbide layer 10 includes a drain region 12, a drift region 14, a p-well region 16, a source region 18, and a p-well contact region 20.

The trench 50 passes through the source region 18 and the p-well region 16 and reaches the drift region 14. The bottom surface of the trench 50 is disposed in the drift region 14.

The gate insulating layer 28 and the gate electrode 30 are provided in the trench 50. The side surface of the trench 50 is, for example, a face having an off angle equal to or more than 0° and equal to or less than 8° with respect to the m-face. In addition, the side surface of the trench 50 is, for example, a face having an off angle equal to or more than 0° and equal to or less than 8° with respect to the a-face.

The p-well region 16 contains, for example, aluminum (Al) as a p-type impurity. The p-type impurity concentration in the p-well region 16 is, for example, equal to or more than 1×10$^{16}$ cm$^{-3}$ and equal to or less than 1×10$^{20}$ cm$^{-3}$.

The depth of the p-well region 16 is, for example, equal to or more than 0.4 μm and equal to or less than 0.8 μm. The p-well region 16 functions as a channel region of the MOSFET 200. The channel region of the MOSFET 200 is in contact with the sidewall surface of the trench 50.

The Hall mobility of electrons in the channel region is, for example, equal to or more than 200 cm$^2$/V·s.

The interface termination region 40 is disposed between the silicon carbide layer 10 and the gate insulating layer 28. The interface termination region 40 is disposed between the drift region 14 and the p-well region 16 and the gate insulating layer 28. The interface termination region 40 contains nitrogen (N) as a termination element for terminating the dangling bond of the silicon carbide layer 10. The interface termination region 40 is an example of the region.

The concentration of nitrogen in the interface termination region 40 is, for example, equal to or more than 1×10$^{21}$ cm$^{-3}$.

Next, an example of the semiconductor device manufacturing method according to the third embodiment will be described.

FIG. 29 is a process flow diagram of the semiconductor device manufacturing method according to the third embodiment. FIGS. 30 to 34 are explanatory diagrams of the semiconductor device manufacturing method according to the third embodiment. FIGS. 30 to 34 are cross-sectional views during manufacturing.

As shown in FIG. 29, the semiconductor device manufacturing method according to the third embodiment includes silicon carbide layer preparation (step S100), aluminum ion implantation (step S101), carbon ion implantation (step S102), phosphorus ion implantation (step S103), aluminum ion implantation (step S104), carbon film formation (step S105), first heat treatment (step S106), carbon film removal (step S107), field oxide film formation (step S108), gate trench formation (step S301), chemical dry etching process (step S109), hydrogen plasma etching process (step S110), silicon oxide film formation (step S111), second heat treatment (step S112), third heat treatment (step S113), gate electrode formation (step S114), interlayer insulating film formation (step S115), and source electrode/drain electrode formation (step S116).

The semiconductor device manufacturing method according to the third embodiment is different from the semiconductor device manufacturing method according to the first embodiment in that the gate trench formation (step S301) is included between the field oxide film formation (step S108) and the chemical dry etching process (step S109).

In step S100, the n-type silicon carbide layer 10 is prepared. The top surface of the n-type silicon carbide layer 10 is a face inclined by an angle equal to or more than 0° and equal to or less than 8° with respect to the silicon face. The silicon carbide layer 10 includes an n$^+$-type drain region 12 and an n$^-$-type drift region 14. The drift region 14 is formed on the drain region 12 by using an epitaxial growth method, for example.

The drain region 12 contains nitrogen as an n-type impurity. The n-type impurity concentration in the drain region 12 is, for example, equal to or more than 1×10$^{18}$ cm$^{-3}$ and equal to or less than 1×10$^{21}$ cm$^{-3}$.

The drift region 14 contains nitrogen as an n-type impurity. The n-type impurity concentration in the drift region 14 is, for example, equal to or more than 1×10$^{15}$ cm$^{-3}$ and equal to or less than 2×10$^{16}$ cm$^{-3}$. The thickness of the drift region 14 is, for example, equal to or more than 5 μm and equal to or less than 100 μm.

In step S101, the p-well region 16 is formed by aluminum ion implantation.

In step S102, carbon is ion-implanted into the p-well region 16.

In step S103, phosphorus (P) is ion-implanted into the p-well region 16 to form the source region 18.

Figure 30:
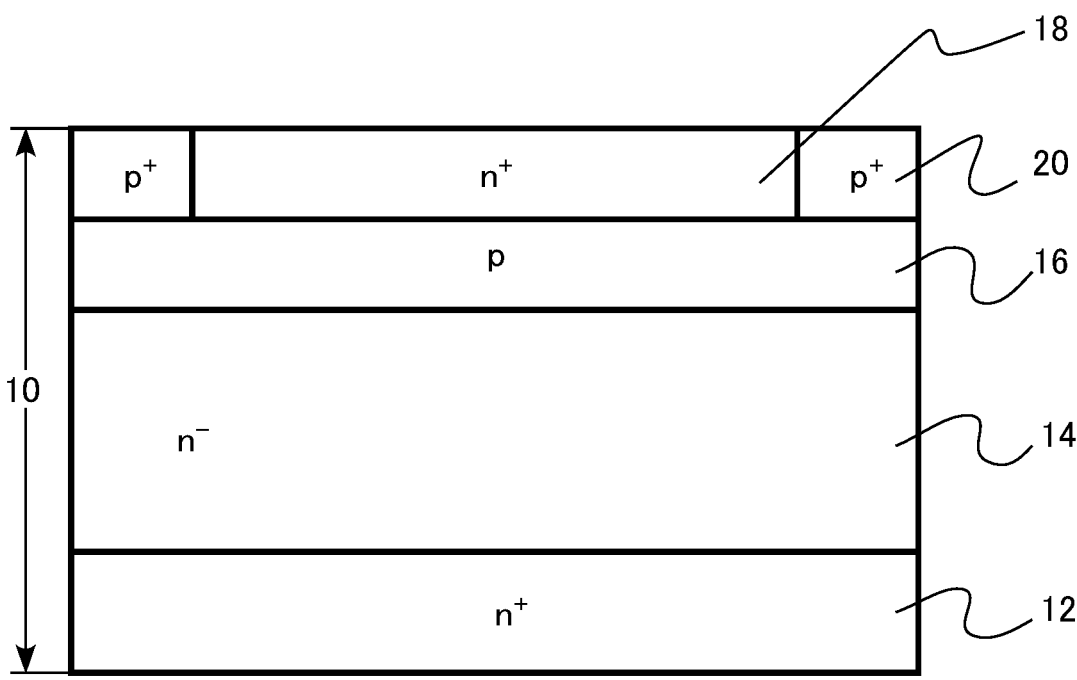
FIG. 30 is an explanatory diagram of the semiconductor device manufacturing method according to the third embodiment.

In step S104, aluminum is ion-implanted into the p-well region 16 to form the p-well contact region 20 (FIG. 30).

In step S105, a carbon film is formed on the silicon carbide layer 10.

In step S106, first heat treatment is performed. The first heat treatment is the activation annealing of aluminum and phosphorus.

In step S107, the carbon film 54 is removed.

In step S108, a field oxide film is formed on the silicon carbide layer 10. Then, the field oxide film is removed.

In step S301, a mask material 71 is formed on the top surface of the silicon carbide layer 10, for example, by forming an insulating film and patterning the insulating film by photolithography and etching.

Figure 31:
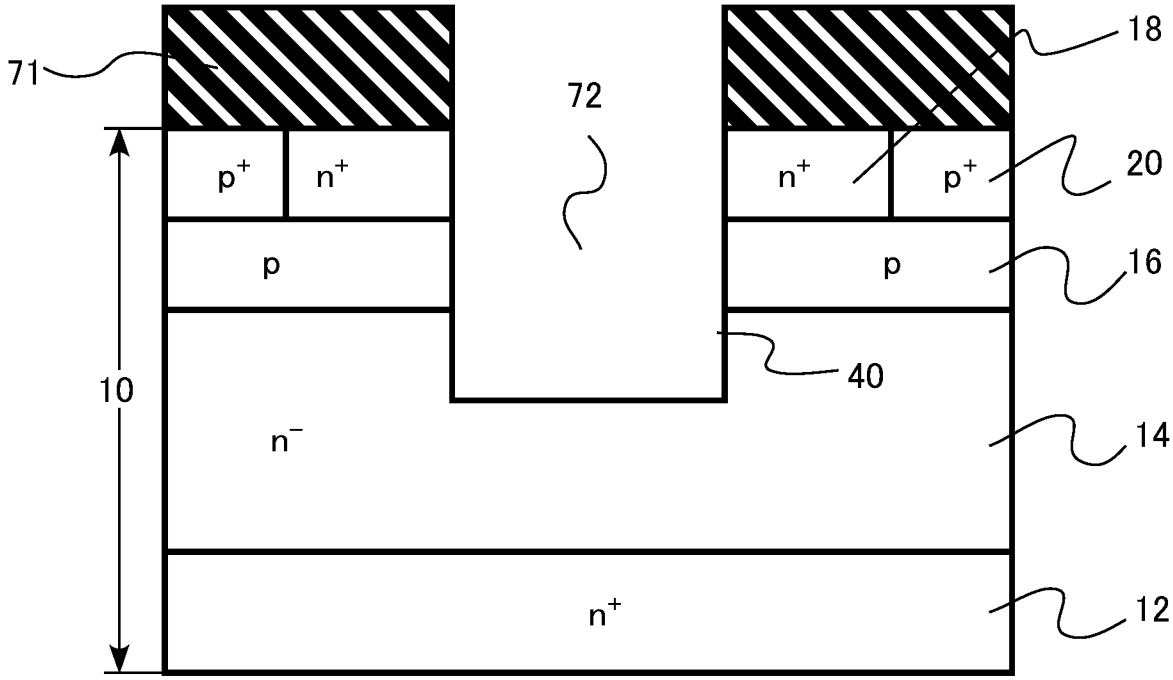
FIG. 31 is an explanatory diagram of the semiconductor device manufacturing method according to the third embodiment.

Then, the n-type silicon carbide layer 10 is etched by using the mask material 71 as a mask to form a gate trench 72 (FIG. 31). The gate trench 72 is formed by using, for example, the RIE method. The gate trench 72 is an example of the trench. The gate trench 72 finally becomes the trench 50.

The sidewall surface of the gate trench 72 has an inclination equal to or more than 0° and equal to or less than 8° with respect to the m-face or an inclination equal to or more than 0° and equal to or less than 8° with respect to the a-face, for example.

Then, the mask material 71 is removed by wet etching, for example.

Figure 32:
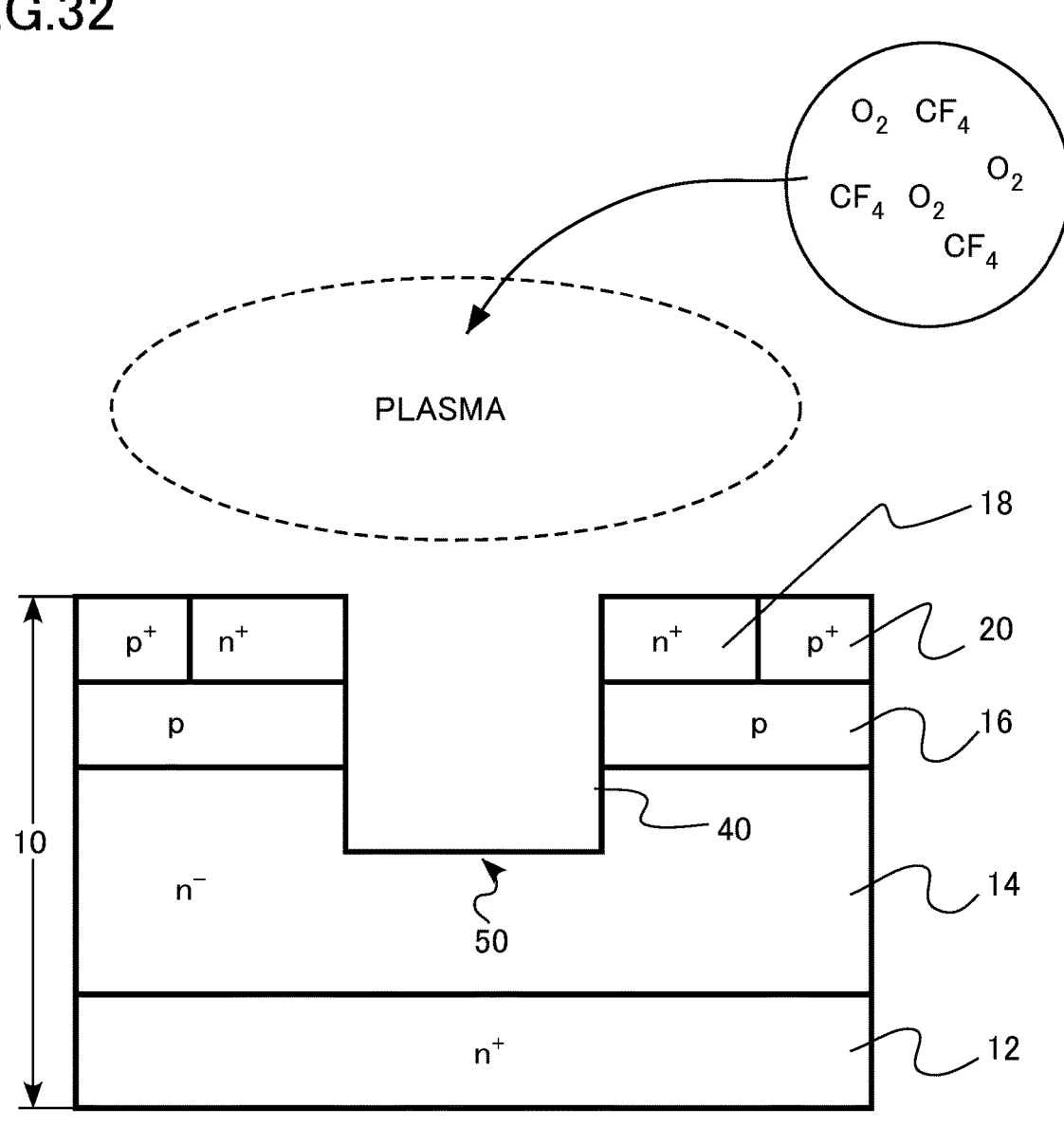
FIG. 32 is an explanatory diagram of the semiconductor device manufacturing method according to the third embodiment.

In step S109, chemical dry etching process for etching the sidewall surface of the gate trench 72 using a chemical dry etching method (CDE method) are performed (FIG. 32). The chemical dry etching process is an example of the first etching process.

Figure 33:
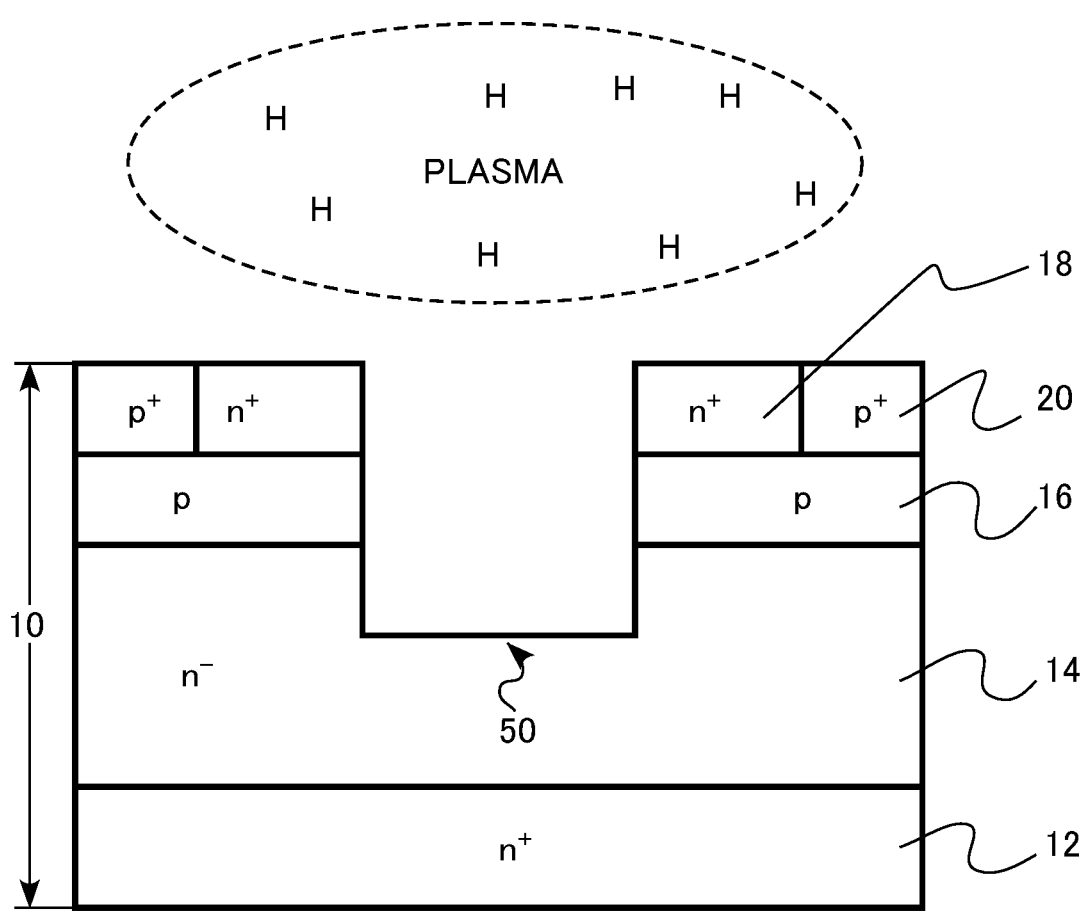
FIG. 33 is an explanatory diagram of the semiconductor device manufacturing method according to the third embodiment.

In step S110, hydrogen etching process is performed to etch the sidewall surface of the gate trench 72 in an atmosphere containing hydrogen plasma or atomic hydrogen (FIG. 33). The hydrogen etching process is an example of the second etching process.

In step S111, a silicon oxide film is formed on the silicon carbide layer 10. The silicon oxide film finally becomes the gate insulating layer 28.

In step S112, second heat treatment is performed. The second heat treatment is performed in an atmosphere containing ammonia gas ($NH_3$). By the second heat treatment, the interface termination region 40 is formed at the interface between the silicon carbide layer 10 and the silicon oxide film.

In step S113, third heat treatment is performed. The third heat treatment is performed in an atmosphere containing nitrogen oxide gas (NOX).

In step S114, the gate electrode 30 is formed on the gate insulating layer 28.

Figure 34:
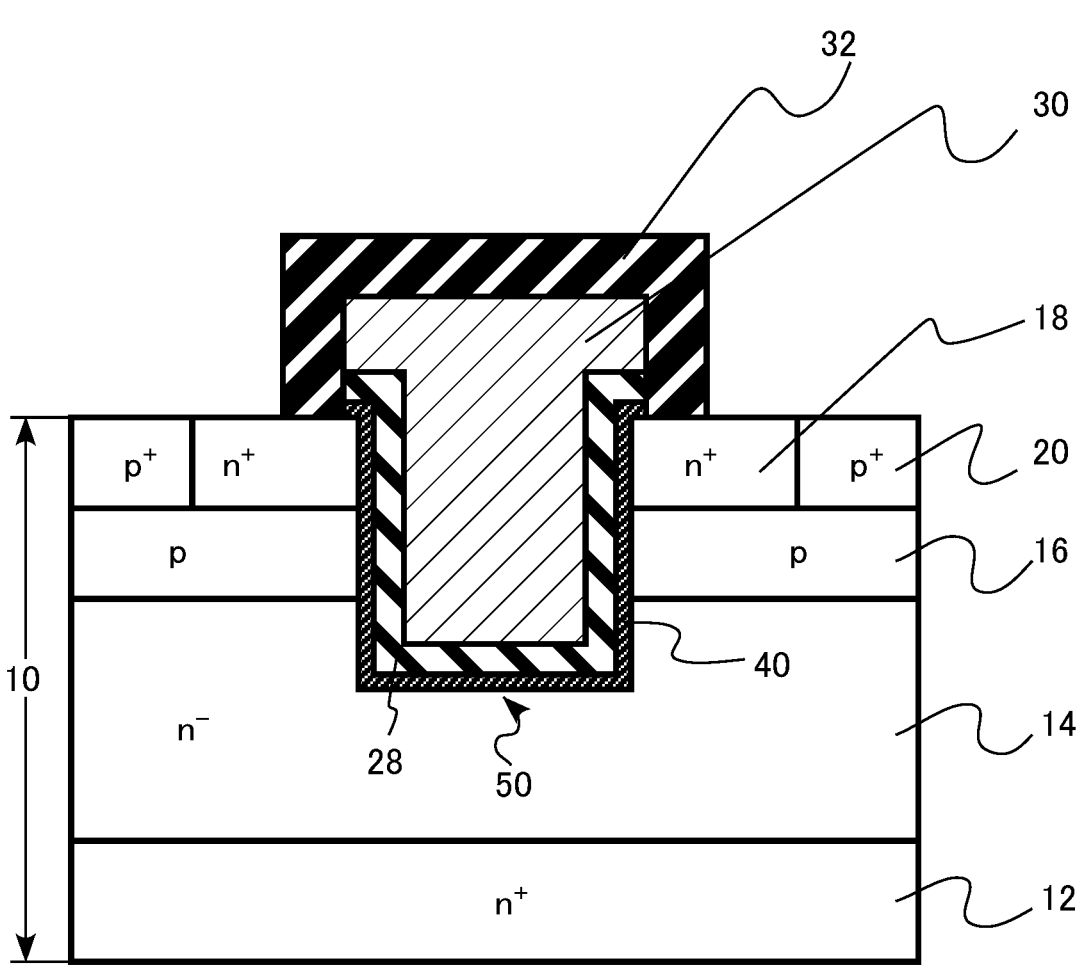
FIG. 34 is an explanatory diagram of the semiconductor device manufacturing method according to the third embodiment.

In step S115, the interlayer insulating film 32 is formed on the gate electrode 30 (FIG. 34).

In step S116, the source electrode 34 and the drain electrode 36 are formed.

By the semiconductor device manufacturing method described above, the MOSFET 200 shown in FIG. 28 is formed.

In the semiconductor device manufacturing method according to the third embodiment, the cleaning process using the CDE method and the hydrogen etching process is performed as in the semiconductor device manufacturing method according to the first embodiment. Therefore, by the same function and effect as in the semiconductor device manufacturing method according to the first embodiment, the carbon vacancy density in the channel region can be reduced and accordingly, a decrease in the carrier mobility of the MOSFET 200 can be suppressed.

The MOSFET 200 manufactured by the semiconductor device manufacturing method according to the third embodiment is a trench gate type MOSFET. The channel region of the MOSFET 200 is in contact with the sidewall surface of the trench 50.

The sidewall surface of the trench 50 has an inclination equal to or more than 0° and equal to or less than 8° with respect to the m-face or an inclination equal to or more than 0° and equal to or less than 8° with respect to the a-face. It is known that the thermal oxidation rate of the m-face and a-face is higher than that of the silicon face.

When the sidewall surface of the trench 50 formed by the m-face or the a-face is subjected to cleaning process using sacrificial oxidation, it is expected that the amount of oxidation will increase and the carbon vacancy density in the channel region will increase compared with the case of the silicon face. As the carbon vacancy density in the channel region increases, the decrease in the carrier mobility of the MOSFET becomes more noticeable.

In the semiconductor device manufacturing method according to the third embodiment, the cleaning process using the CDE method and the hydrogen etching process is performed instead of the cleaning process using sacrificial oxidation. In the semiconductor device manufacturing method according to the third embodiment, thermal oxidation is not performed. Therefore, even in the m-face or the a-face, the decrease in the carrier mobility of the MOSFET 200 can be suppressed as in the case of the silicon face. It can be said that the semiconductor device manufacturing method according to the third embodiment is particularly effective for a MOSFET having a trench gate structure in which the channel region is in contact with the m-face or the a-face.

As described above, according to the third embodiment, a semiconductor device manufacturing method is realized in which the carbon vacancy density in the channel region is reduced by performing the cleaning process using the CDE method and the hydrogen etching process and accordingly a decrease in carrier mobility can be suppressed.

Fourth Embodiment

A semiconductor device manufacturing method according to a fourth embodiment includes: forming a p-type silicon carbide film on an n-type silicon carbide layer using an epitaxial growth method; forming a trench in the silicon carbide film before performing a first etching process after forming the silicon carbide film; performing the first etching process etching a surface of the silicon carbide film in an atmosphere containing plasma generated from a gas containing halogen and oxygen; performing a second etching process etching the surface in an atmosphere containing hydrogen plasma or atomic hydrogen; forming a silicon oxide film on the surface; and forming a gate electrode on the silicon oxide film. The semiconductor device manufacturing method according to the fourth embodiment is different from the semiconductor device manufacturing method according to the third embodiment in that a p-type silicon carbide film is formed by using an epitaxial growth method. Hereinafter, the description of a part of the content overlapping the third embodiment may be omitted.

A semiconductor device manufactured by the semiconductor device manufacturing method according to the fourth embodiment has the same structure as the semiconductor device manufactured by the semiconductor device manufacturing method according to the third embodiment shown in FIG. 28. However, the p-well is formed by using an epitaxial growth method rather than ion implantation.

Figure 36:
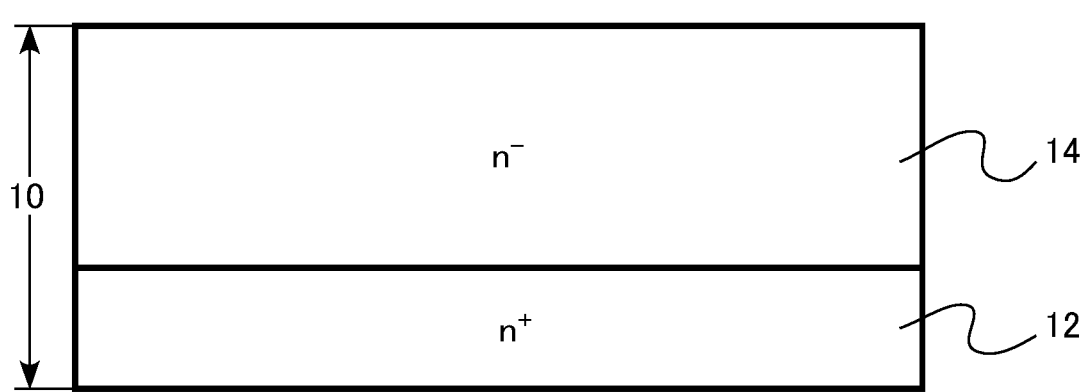
FIG. 36 is an explanatory diagram of the semiconductor device manufacturing method according to the fourth embodiment.
Figure 37:
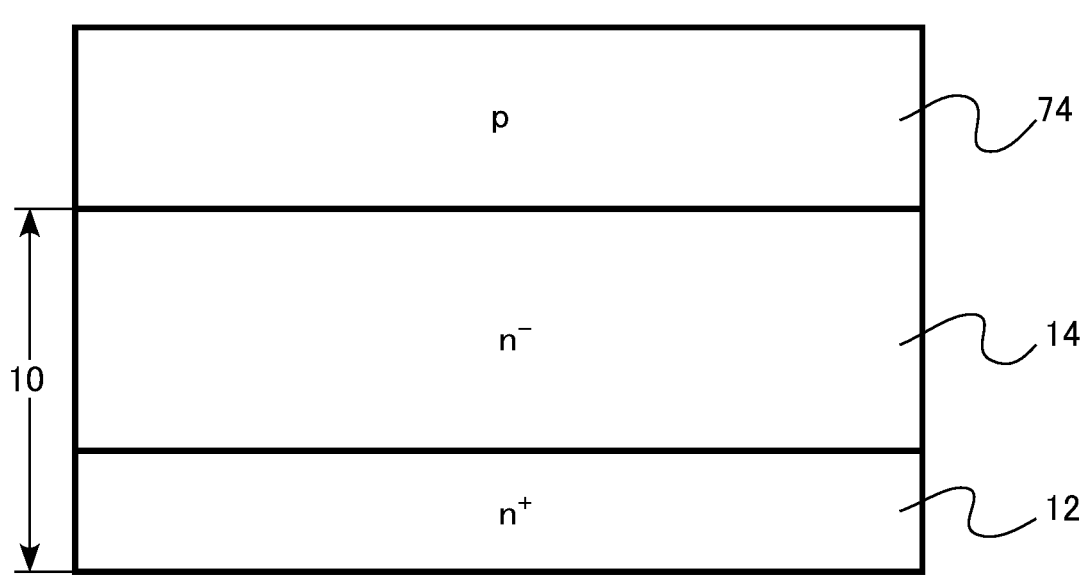
FIG. 37 is an explanatory diagram of the semiconductor device manufacturing method according to the fourth embodiment.

FIG. 35 is a process flow diagram of the semiconductor device manufacturing method according to the fourth embodiment. FIGS. 36 and 37 are explanatory diagrams of the semiconductor device manufacturing method according to the fourth embodiment. FIGS. 36 and 37 are cross-sectional views during manufacturing.

As shown in FIG. 35, the semiconductor device manufacturing method according to the fourth embodiment includes silicon carbide layer preparation (step S100), epi-taxial film formation (step S401), phosphorus ion implantation (step S103), aluminum ion implantation (step S104), carbon film formation (step S105), first heat treatment (step S106), carbon film removal (step S107), field oxide film formation (step S108), gate trench formation (step S301), chemical dry etching process (step S109), hydrogen plasma etching process (step S110), silicon oxide film formation (step S111), second heat treatment (step S112), third heat treatment (step S113), gate electrode formation (step S114), interlayer insulating film formation (step S115), and source electrode/drain electrode formation (step S116).

The semiconductor device manufacturing method according to the fourth embodiment is different from the semiconductor device manufacturing method according to the third embodiment shown in FIG. 29 in that the epitaxial film formation (step S401) is included instead of the aluminum ion implantation (step S101) and the carbon ion implantation (step S102).

In step S100, the n-type silicon carbide layer 10 is prepared (FIG. 36).

In step S401, a p-type silicon carbide film 74 is formed on the n-type silicon carbide layer 10 by using an epitaxial growth method (FIG. 37). A part of the p-type silicon carbide film 74 finally becomes the p-well region 16.

Thereafter, steps S103 to S116 are performed by using the same method as in the semiconductor device manufacturing method according to the third embodiment.

In the semiconductor device manufacturing method according to the fourth embodiment, the cleaning process using the CDE method and the hydrogen etching process is performed as in the semiconductor device manufacturing method according to the third embodiment. Therefore, by the same function and effect as in the semiconductor device manufacturing method according to the third embodiment, the carbon vacancy density in the channel region can be reduced and accordingly, a decrease in the carrier mobility of the MOSFET 200 can be suppressed.

As described above, according to the fourth embodiment, a semiconductor device manufacturing method is realized in which the carbon vacancy density in the channel region is reduced by performing the cleaning process using the CDE method and the hydrogen etching process and accordingly a decrease in carrier mobility can be suppressed.

As described above, in the first to fourth embodiments, the case of 4H—SiC has been described as an example of the crystal structure of silicon carbide. However, embodiments can also be applied to silicon carbide having other crystal structures, such as 6H—SiC and 3C—SiC.

In addition, in the first to fourth embodiments, the case where the gate insulating layer 28 is provided on the silicon face of the silicon carbide layer, the m-face, or the a-face has been described as an example. However, embodiments can also be applied to a case where the gate insulating layer 28 is provided on the other faces of silicon carbide, for example, a carbon face or a (0-33-8) face.

In addition, embodiments can also be applied to an n-channel insulated gate bipolar transistor (IGBT).

While certain embodiments have been described, these embodiments have been presented by way of example only, and are not intended to limit the scope of the inventions. Indeed, the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device manufacturing method, comprising:

performing a first ion implantation implanting aluminum into a silicon carbide layer with a first dose amount;

performing a first heat treatment at a temperature equal to or more than 1600° C.;

performing a first etching process etching a surface of the silicon carbide layer in an atmosphere containing plasma generated from a gas containing halogen and oxygen;

performing a second etching process etching the surface in an atmosphere containing hydrogen plasma or atomic hydrogen;

forming a silicon oxide film on the surface; and forming a gate electrode on the silicon oxide film.

2. The semiconductor device manufacturing method according to claim 1, further comprising:

performing a second ion implantation implanting carbon into the silicon carbide layer with a second dose amount before the performing the first heat treatment, the second dose amount being equal to or more than ten times the first dose amount.

3. The semiconductor device manufacturing method according to claim 1, wherein the first etching process is performed by using an etching apparatus in which a plasma generation unit and an etching processing unit are separated from each other.

4. The semiconductor device manufacturing method according to claim 1, wherein the first etching process is isotropic etching process.

5. The semiconductor device manufacturing method according to claim 1, wherein, in the first etching process, the gas contains perfluorocarbon.

6. The semiconductor device manufacturing method according to claim 1, wherein the first etching process is performed at a temperature equal to or more than 20° C. and equal to or less than 1300° C.

7. The semiconductor device manufacturing method according to claim 1, wherein the second etching process is performed at a temperature equal to or more than 20° C. and equal to or less than 300° C.

8. The semiconductor device manufacturing method according to claim 1, wherein, in the first etching process, the surface is etched by 5 nm or more and 50 nm or less.

9. The semiconductor device manufacturing method according to claim 1, wherein, in the second etching process, the surface is etched by 5 nm or more and 25 nm or less.

10. The semiconductor device manufacturing method according to claim 1, wherein the surface has an inclination equal to or more than 0° and equal to or less than 8° with respect to an a-face or an inclination equal to or more than 0° and equal to or less than 8° with respect to an m-face.

11. The semiconductor device manufacturing method according to claim 1, further comprising:

forming a trench in the silicon carbide layer before the performing the first etching process after the performing the first heat treatment, and wherein the surface is a sidewall surface of the trench.

12. A semiconductor device manufacturing method, comprising:

forming a p-type silicon carbide film on an n-type silicon carbide layer using an epitaxial growth method;

performing a first etching process etching a surface of the silicon carbide film in an atmosphere containing plasma generated from a gas containing halogen and oxygen;

performing a second etching process etching the surface in an atmosphere containing hydrogen plasma or atomic hydrogen;

forming a silicon oxide film on the surface; and forming a gate electrode on the silicon oxide film.

13. The semiconductor device manufacturing method according to claim 12, wherein the first etching process is performed by using an etching apparatus in which a plasma generation unit and an etching processing unit are separated from each other.

14. The semiconductor device manufacturing method according to claim 12, wherein the first etching process is isotropic etching process.

15. The semiconductor device manufacturing method according to claim 12, wherein, in the first etching process, the gas contains perfluorocarbon.

16. The semiconductor device manufacturing method according to claim 12, wherein the first etching process is performed at a temperature equal to or more than 20° C. and equal to or less than 1300° C.

17. The semiconductor device manufacturing method according to claim 12, wherein the second etching process is performed at a temperature equal to or more than 20° C. and equal to or less than 300° C.

18. The semiconductor device manufacturing method according to claim 12, wherein, in the first etching process, the surface is etched by 5 nm or more and 50 nm or less.

19. The semiconductor device manufacturing method according to claim 12, wherein, in the second etching process, the surface is etched by 5 nm or more and 25 nm or less.

20. The semiconductor device manufacturing method according to claim 12, wherein the surface has an inclination equal to or more than 0° and equal to or less than 8° with respect to an a-face or an inclination equal to or more than 0° and equal to or less than 8° with respect to an m-face.

21. The semiconductor device manufacturing method according to claim 12, further comprising:

forming a trench in the silicon carbide layer before the performing the first etching process after the performing the first heat treatment, and wherein the surface is a sidewall surface of the trench.

* * * * *